United States Patent
Kato et al.

(10) Patent No.: US 9,236,581 B2
(45) Date of Patent: Jan. 12, 2016

(54) DISPLAY UNIT, METHOD OF MANUFACTURING DISPLAY UNIT, AND ELECTRONIC APPARATUS

(71) Applicant: Sony Corporation, Tokyo (JP)

(72) Inventors: Takayoshi Kato, Kanagawa (JP); Seiichi Yokoyama, Kanagawa (JP); Mitsuharu Shoji, Kanagawa (JP); Takashi Sakairi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/284,884

(22) Filed: May 22, 2014

(65) Prior Publication Data

US 2015/0048328 A1 Feb. 19, 2015

(30) Foreign Application Priority Data

May 29, 2013 (JP) ................. 2013-112694

(51) Int. Cl.
| | |
|---|---|
| H01L 27/32 | (2006.01) |
| H01L 51/50 | (2006.01) |
| H01L 51/52 | (2006.01) |
| H01L 51/56 | (2006.01) |

(52) U.S. Cl.
CPC ........ *H01L 51/5056* (2013.01); *H01L 27/3246* (2013.01); *H01L 51/5088* (2013.01); *H01L 27/322* (2013.01); *H01L 51/504* (2013.01); *H01L 51/5209* (2013.01); *H01L 51/5218* (2013.01)

(58) Field of Classification Search
None
See application file for complete search history.

(56) References Cited

U.S. PATENT DOCUMENTS

| | | | |
|---|---|---|---|
| 2008/0284323 A1* | 11/2008 | Kashiwabara et al. | 313/504 |
| 2011/0095276 A1* | 4/2011 | Imai et al. | 257/40 |
| 2011/0127500 A1* | 6/2011 | Ko et al. | 257/40 |
| 2011/0186820 A1* | 8/2011 | Kim | C23C 14/044 257/40 |

FOREIGN PATENT DOCUMENTS

JP 2012-216495 A 11/2012

* cited by examiner

*Primary Examiner* — Khaja Ahmad
(74) *Attorney, Agent, or Firm* — Sheridan Ross P.C.

(57) ABSTRACT

A display unit includes a plurality of first electrodes provided to respective pixels; an insulating layer having an opening facing each of the first electrodes and having an overhang at an edge of the opening; a charge injection-transport layer being cut or having higher resistance at the overhang of the insulating layer to exhibit one or both of a charge injection property and a charge transport property; an organic layer including one light-emitting layer or a plurality of light-emitting layers common to all of the pixels; and a second electrode formed on an entire surface of the organic layer, the first electrodes, the insulating layer, the charge injection-transport layer, the organic layer, and the second electrode being disposed in this order from a substrate side.

20 Claims, 26 Drawing Sheets

DISPLAY UNIT, METHOD OF MANUFACTURING DISPLAY UNIT, AND ELECTRONIC APPARATUS

CROSS REFERENCE TO RELATED APPLICATIONS

This application claims the benefit of Japanese Priority Patent Application JP 2013-112694 filed May 29, 2013, the entire contents which are incorporated herein by reference.

BACKGROUND

The present technology relates to a display unit including an organic electroluminescence device provided with an insulating film as a device isolation film, a method of manufacturing the same, and an electronic apparatus including such a display unit.

In recent years, as one flat panel display, an organic EL display using an organic electroluminescence (EL) device has been attracting attention. Since the organic EL display does not need a backlight, reduction in thickness and weight of the organic EL display is achievable. Moreover, since the organic EL display is a self-luminous type display, the organic EL display has characteristics of a wide viewing angle and low power consumption, and has been developed for practical use.

Such an organic EL display is allowed to achieve high contrast and high color reproducibility, for example, by forming light-emitting layers of respective colors RGB for respective pixels (color-coding). On the other hand, to enhance resolution, reduction in pixel pitch is desired. However, the finer the pixel pitch is, the more difficult the above-described color-coding of the light-emitting layers becomes. Therefore, a technique of forming a white light-emitting layer in all pixels and separating white light into light of colors RGB with use of color filters is used (for example, refer to Japanese Unexamined Patent Application Publication No. 2012-216495).

SUMMARY

In a display unit in Japanese Unexamined Patent Application Publication No. 2012-216495, an organic layer including a light-emitting layer is formed over all pixels between a first electrode and a second electrode provided to each of the pixels. It is desirable to reduce leakage of a drive current (current leakage between pixels) in such a configuration.

It is desirable to provide a display unit capable of reducing current leakage in a device configuration including a light-emitting layer common to all pixels, a method of manufacturing a display unit, and an electronic apparatus.

According to an embodiment of the present technology, there is provided a display unit including: a plurality of first electrodes provided to respective pixels; an insulating layer having an opening facing each of the first electrodes and having an overhang at an edge of the opening; a charge injection-transport layer being cut or having higher resistance at the overhang of the insulating layer to exhibit one or both of a charge injection property and a charge transport property; an organic layer including one light-emitting layer or a plurality of light-emitting layers common to all of the pixels; and a second electrode formed on an entire surface of the organic layer, the first electrodes, the insulating layer, the charge injection-transport layer, the organic layer, and the second electrode being disposed in this order from a substrate side.

According to an embodiment of the present technology, there is provided an electronic apparatus provided with a display unit, the display unit including: a plurality of first electrodes provided to respective pixels; an insulating layer having an opening facing each of the first electrodes and having an overhang at an edge of the opening; a charge injection-transport layer being cut or having higher resistance at the overhang of the insulating layer to exhibit one or both of a charge injection property and a charge transport property; an organic layer including one light-emitting layer or a plurality of light-emitting layers common to all of the pixels; and a second electrode formed on an entire surface of the organic layer, the first electrodes, the insulating layer, the charge injection-transport layer, the organic layer, and the second electrode being disposed in this order from a substrate side.

In the display unit and the electronic apparatus according to the embodiments of the present technology, the insulating layer having an opening facing each of the first electrodes provided to respective pixels is included, and the overhang is provided at the edge of the opening of the insulating layer; therefore, the charge injection-transport layer is formed so as to be cut or to have higher resistance. Accordingly, in a configuration in which the organic layer including the light-emitting layer is provided common to all of the pixels, the charge injection-transport layer is electrically blocked at a boundary between adjacent pixels.

According to an embodiment of the present technology, there is provided a method of manufacturing a display unit, the method including: forming a plurality of first electrodes provided to respective pixels on a substrate; forming an insulating layer on the plurality of first electrodes, the insulating layer having an opening facing each of the first electrodes and having an overhang at an edge of the opening; forming a charge injection-transport layer on the insulating layer, the charge-injection-transport layer being cut or having higher resistance at the overhang of the insulating layer to exhibit one or both of a charge injection property and a charge transport property; forming, on the charge injection-transport layer, an organic layer including a light-emitting layer common to all of the pixels; and forming a second electrode on an entire surface of the organic layer.

In the method of manufacturing the display unit according to the embodiment of the present technology, the insulating layer has an opening facing each of the first electrodes provided to respective pixels, and has the overhang at the edge of the opening; therefore, the charge injection-transport layer is formed to be cut or to have higher resistance at the overhang. Accordingly, in a configuration in which the organic layer including the light-emitting layer is provided common to all of the pixels, the charge injection-transport layer is electrically blocked at a boundary between adjacent pixels.

In the display unit and the electronic apparatus according to the embodiment of the present technology, in a configuration in which the organic layer including the light-emitting layer is provided common to all of the pixels by including the insulating layer having an opening facing each of the first electrodes provided to respective pixels and having the overhang at the edge of the opening of the insulating layer, the charge injection-transport layer is allowed to be electrically blocked at a boundary between adjacent pixels. Therefore, in the device configuration including the common light-emitting layer for all of the pixels, current leakage is allowed to be reduced.

In the method of manufacturing the display unit according to the embodiment of the present technology, while the charge injection-transport layer is electrically blocked at a boundary between adjacent pixels, a configuration in which the organic layer including the light-emitting layer is provided common to all of the pixels by including the insulating layer having an opening facing each of the first electrodes provided to respective pixels and having the overhang at the edge of the opening of the insulating layer is allowed to be formed. Therefore, in the device configuration including the common light-emitting layer for all of the pixels, current leakage is allowed to be reduced.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

FIG. 30 is a plan view illustrating a schematic configuration of a module including the display unit according to any of the embodiments and the like.

DETAILED DESCRIPTION

Some embodiments of the present technology will be described detail below referring to the accompanying drawings. It is to be noted that description will be given in the following order.

Figure 1:
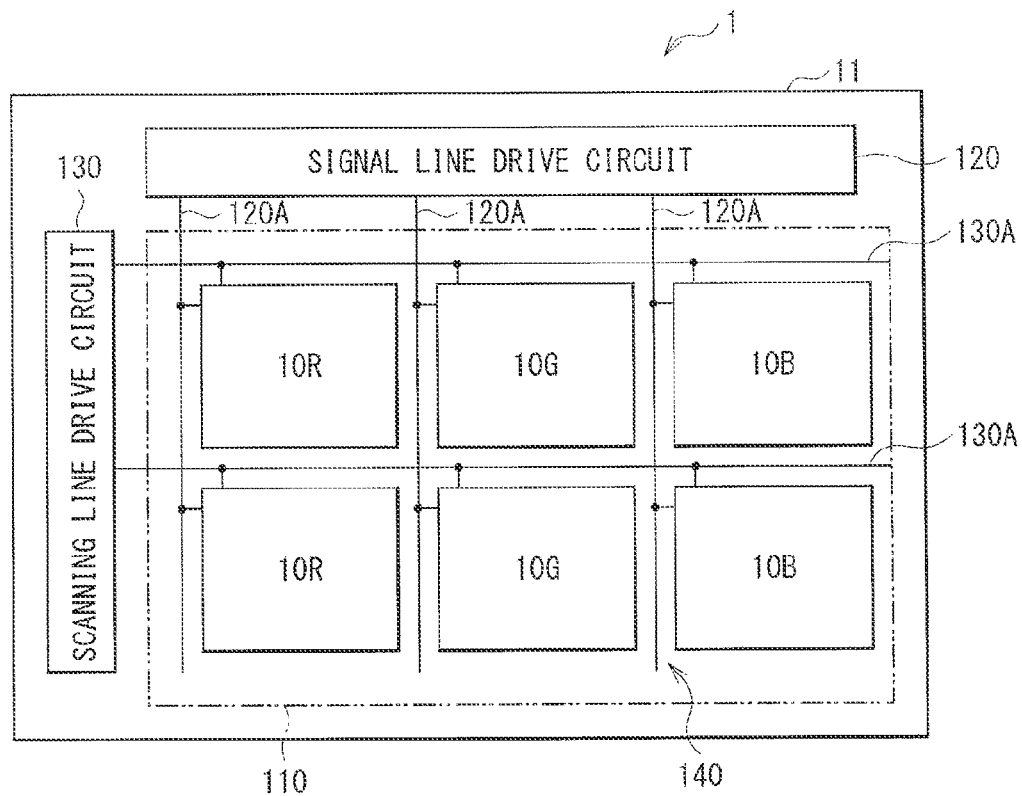
FIG. 1 is a diagram illustrating a configuration of a display unit according to a first embodiment of the present technology.

1. First Embodiment (Example in which an insulating layer is configured of two layers to form an overhang)
2. Modification Example 1 (Example in which an overhang is formed with use of an oxide layer formed in a surface layer of a first electrode)
3. Modification Example 2 (Example in which a surface of a first electrode is selectively removed to form an overhang).
4. Second Embodiment (Example in which an overhang is formed while an insulating layer between first electrodes is planarized)
5. Modification Example 3 (Another example of planarization)
6. Application Examples First Embodiment Configuration FIG. 1 illustrates a configuration of a display unit (a display unit 1) according to a first embodiment of the present technology. The display unit 1 is an organic EL display unit, and a plurality of organic EL devices 10R, 10G, and 10B are arranged as pixels in a matrix form in a display region 110 of a substrate 11. The organic EL devices 10R, 10G, and 10B emit red light (with a wavelength of about 620 nm to about 750 nm), green light (with a wavelength of about 495 nm to about 570 nm), and blue light (with a wavelength of about 450 nm to about 495 nm), respectively. A signal line drive circuit 120 and a scanning line drive circuit 130 for image display are provided to a periphery of the display region 110.

Figure 2:
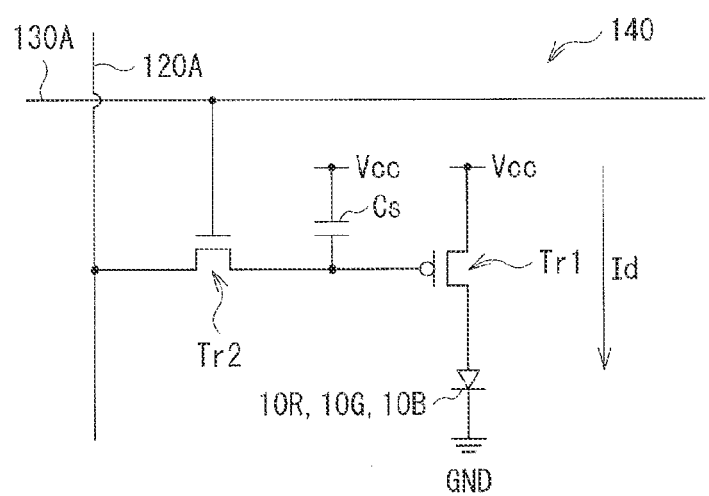
FIG. 2 is a diagram illustrating an example of a pixel drive circuit illustrated in FIG. 1.

An active drive circuit (a pixel drive circuit 140) is provided in the display region 110. As illustrated in FIG. 2, the pixel drive circuit 140 includes a drive transistor Tr1 and a write transistor Tr2, and a capacitor Cs is provided between the transistors Tr1 and Tr2. The organic EL device 10R (or the organic EL device 10G or 10B) is connected in series to the transistor Tr1 between a first power supply line (Vcc) and a second power supply line (GND). The signal line drive circuit 120 supplies an image signal to a source electrode of the transistor Tr2 through a plurality of signal lines 120A arranged along a column direction. The scanning line drive circuit 130 sequentially supplies a scanning signal to a gate electrode of the transistor Tr2 through a plurality of scanning lines 130A arranged along a row direction.

Figure 3:
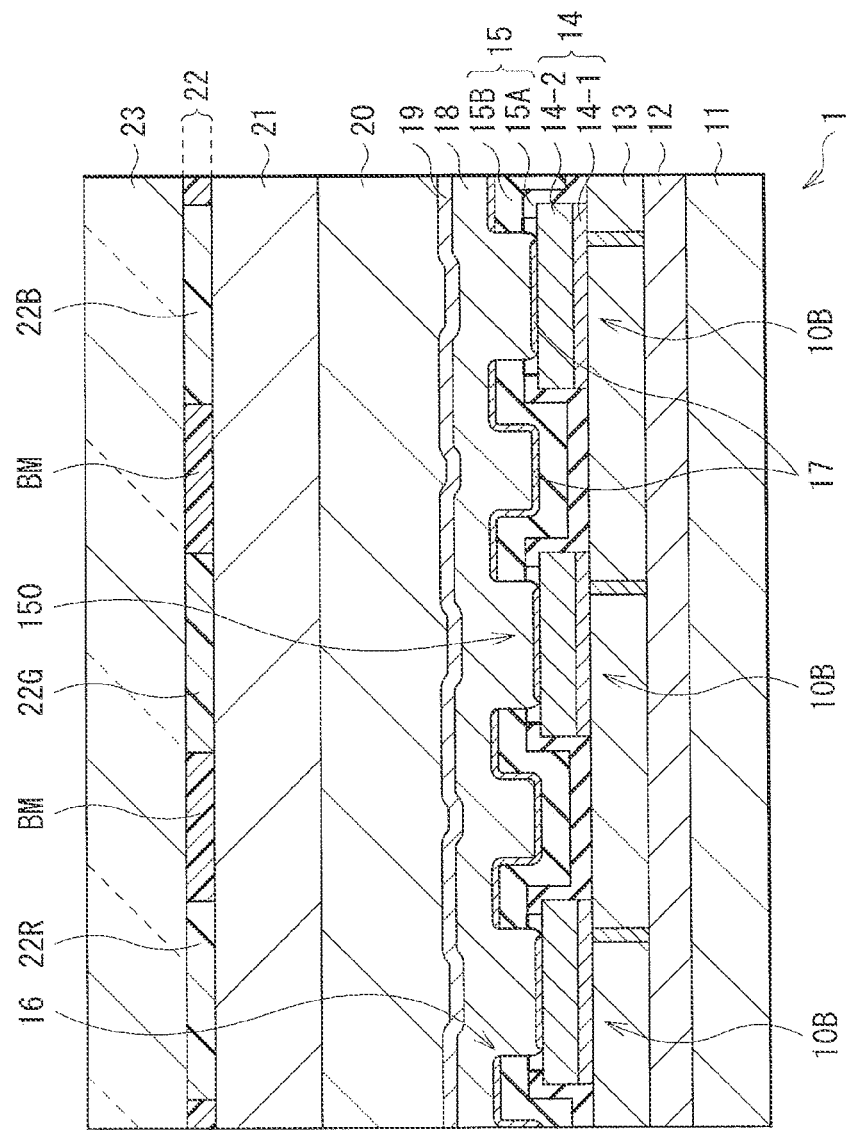
FIG. 3 is a sectional view illustrating a configuration of the display unit illustrated in FIG. 1.

FIG. 3 illustrates a sectional configuration of the display unit illustrated in FIG. 1. It is to be noted that FIG. 3 illustrates respective regions corresponding to the organic EL devices 10R, 10G, and 10B. Each of the organic EL devices 10R, 10G, and 10B has a configuration in which a drive circuit layer 12 including the above-described pixel drive circuit 140, a planarization layer 13, a first electrode 14 as, for example, an anode, an insulating layer 15, a hole injection layer (HIL) 17, an organic layer 18 including a light-emitting layer, and a second electrode 19 as, for example, a cathode are laminated in this order from the substrate 11. These organic EL devices 10R, 10G, and 10B are covered with a protective layer 20. The organic EL devices 10R, 10G, and 10B are sealed on the substrate 11 by bonding a sealing substrate 23 to the protective layer 20 with an adhesive layer 21 in between. A color filter layer 22 is formed on a surface located closer to the substrate 11 of the sealing substrate 23. It is to be noted that the hole injection layer 17 in this embodiment corresponds to a specific example of "charge injection-transport layer" in an embodiment of the present technology.

The display unit 1 may be, for example, a so-called top emission type organic EL display unit in which light emitted from the organic layer 18 is extracted from the second electrode 19. Moreover, in the display unit 1, the organic layer 18 includes a common light-emitting layer for the organic EL devices 10R, 10G, and 10B (pixels). Further, each of the hole injection layer 17, the organic layer 18, and the second electrode 19 is continuously formed in a solid film form without being patterned for each pixel. The organic layer 18 may be configured to emit, for example, white light, and when the white light passes through the color filter layer 22, the color filter layer 22 may separate the white light into, for example, light of colors RGB to emit the light of the colors RGB. Configurations of respective components will be described below.

The substrate 11 may be configured of, for example, glass, a silicon (Si) wafer, a resin, or a conductive substrate. As the conductive substrate, for example, a substrate of which a surface is insulated by silicon oxide ($SiO_2$), a resin, or the like may be used.

Although not illustrated, for example, pixel transistors such as the above-described drive transistor Tr1 and the above-described write transistor Tr2, the capacitor Cs, and the like may be formed in the drive circuit layer 12. Each of the pixel transistors may be, for example, a bottom gate or a top gate thin film transistor, and may be configured of, for example, a MOSFET (Metal Oxide Semiconductor Field Effect Transistor).

The planarization layer 13 is configured to planarize a surface where the drive circuit layer 12 is formed of the substrate 11. Since a fine connection hole 13A is provided to the planarization layer 13, the planarization layer 13 may be preferably made of a material with high pattern precision. A plug 13B made of conductive metal is embedded in the connection hole 13A. The drive transistor Tr1 of the drive circuit layer 12 is configured to be electrically connected to the first electrode 13 through the plug 13B disposed in the connection hole 13A. Examples of a material of the planarization layer 13 may include organic materials such as acrylic and polyimide, and inorganic materials such as silicon oxide ($SiO_2$), silicon nitride ($SiN_x$), and silicon oxynitride (SiON).

The first electrodes 14 are provided to respective pixels so as to be electrically isolated from one another, and also have a function as a reflective layer. Therefore, the first electrodes 14 may preferably have highest possible reflectivity to enhance light emission efficiency. However, when the first electrodes 14 are formed of, for example, a metal material with high reflectivity such as aluminum (Al), an aluminum alloy, or a silver (Ag) alloy, in terms of hole injection barrier, it is difficult to use a material with a high resistance value for a layer (for example, the hole injection layer 17) in contact with the first electrodes 14. In other words, a leak current is easily generated at a boundary between adjacent pixels. As will be described in detail later, in this embodiment, generation of the leak current is reduced by an overhang provided to an opening 150 of the insulating layer 15; therefore, a material with high reflectivity is allowed to be used for the first electrodes 14.

Moreover, since each of the first electrodes 14 is used as an anode, each of the first electrodes 14 may be preferably made of a material with a high hole injection property. A thickness in a laminate direction (hereinafter simply referred to as "thickness") of each of such first electrodes 14 may be, for example, within a range of about 30 nm to about 1000 nm both inclusive. Moreover, a pitch of each of the first electrodes 14 (an interval between adjacent first electrodes 14) may be, for example, within a range of about 200 nm to about 1000 nm both inclusive. As a material of the first electrodes 14, a simple substance or an alloy of a metal element such as chromium (Cr), gold (Au), platinum (Pt), nickel (Ni), copper (Cu), molybdenum (Mo), tungsten (W), titanium (Ti), tantalum (Ta), or silver (Ag) may be adopted. A transparent conductive film made of an oxide of indium and tin (ITO) or the like may be provided to a surface of each of the first electrodes 14. The thickness of each of the first electrodes is determined as appropriate by balance between wiring resistance and reflectivity (surface roughness). It is to be noted that, in a case of a so-called bottom emission type display unit, each of the first electrodes 14 is configured of a transparent conductive film.

In addition to the above-described materials, a simple substance or an alloy of aluminum (Al) may be used for the first electrodes 14. In aluminum, a hole injection barrier caused by the presence of an oxide film on a surface thereof and low work function in spite of high reflectivity causes an issue; however, aluminum is allowed to be used for the first electrodes 14 by providing an appropriate hole injection layer 17. In this case, each of the first electrodes 14 may have, for example, a configuration in which a metal layer 14-1 made of titanium, tungsten, copper, tantalum, molybdenum, or the like and a metal layer 14-2 made of aluminum are laminated.

The insulating layer 15 is configured to electrically isolate the first electrodes 14 for respective pixels from one another, and to secure insulation between the first electrodes 14 and the second electrode 19. The insulating layer 15 has the openings 150 facing the respective first electrodes 14, and is provided to be put over an outer edge of each of the first electrodes 14 from a surface (a surface facing the second electrode 19) to a side surface (an end surface). The overhang 16 is formed at an edge of each of the openings 150.

Figure 4A:
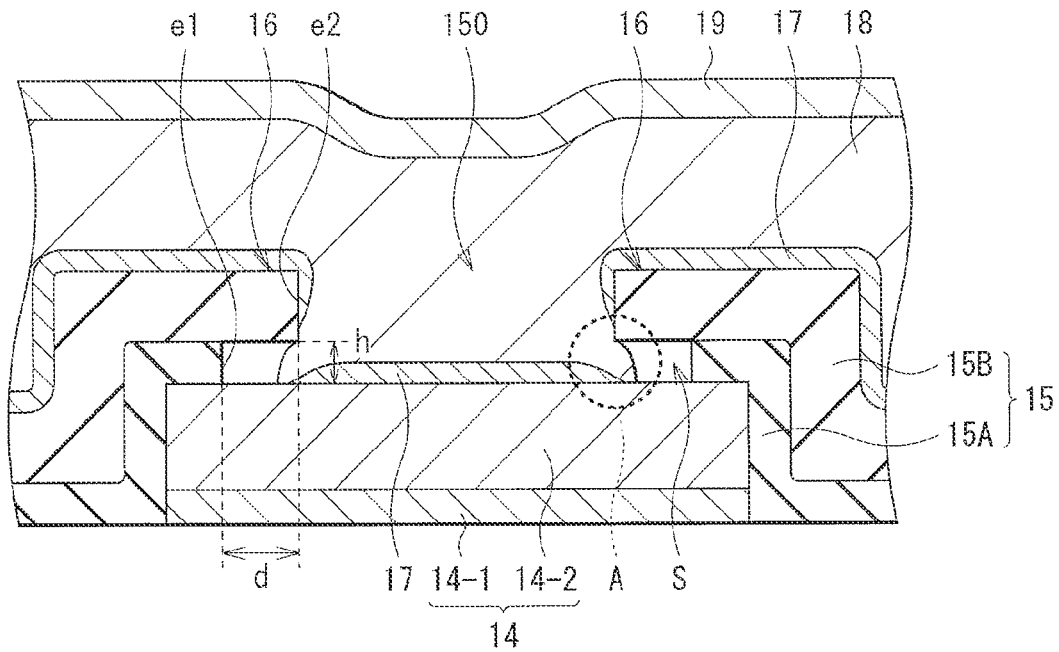
FIG. 4A is an enlarged sectional view around an opening of an insulating film illustrated in FIG. 3.

FIG. 4A illustrates an enlarged view of a configuration around the opening 150. The insulating layer 15 may have a configuration in which a first insulating layer 15A and a second insulating layer 15B are laminated in order from the first electrode 14. The first insulating layer 15A and the second insulating layer 15B may be made of, for example, materials allowed to obtain etching selectivity and different from each other that are selected from inorganic insulating materials such as silicon oxide, silicon oxynitride, and aluminum oxide. Since, in a manufacturing process that will be described later, the overhang 16 is easily formed into a desired shape with use of such inorganic insulating materials, compared to organic insulating materials (for example, a photopolymer), such inorganic insulating materials may be preferable. In this embodiment, for example, the first insulating layer 15A may be made of silicon nitride or silicon oxynitride, and the second insulating layer 15B may be made of silicon oxide. Moreover, the first insulating layer 15A may have, for example, a thickness of about 10 nm to about 50 nm both inclusive, and the second insulating layer 15B may have, for example, a thickness of about 40 nm to about 90 nm both inclusive. The thicknesses of the first insulating layer 15A and the second insulating layer 15B are not limited; however, the thickness of the second insulating layer 15B may be preferably larger than the thickness of the first insulating layer 15A.

In this case, since a height h and a width d of the overhang 16 are determined mainly by the thickness of the first insulating layer 15A, to easily cut the hole injection layer 17 by the overhang 16, the height h may be preferably large (in other words, the thickness of the first insulating layer 15A may be preferably large). However, when the thickness of the first insulating layer 15A is too large, in a following process of evaporating the organic layer 18, a thin portion of the organic layer 18 may be easily formed in part. Moreover, when a total thickness of the first insulating layer 15A and the second insulating layer 15B is too large, in the process of evaporating the organic layer 18, deposition may be deteriorated. Therefore, each of the thicknesses of the first insulating layer 15A and the second insulating layer 15B may be preferably within the above-described thickness range, and may be preferably set to a value that does not affect evaporation of the organic layer 18 while securing a thickness capable of cutting the hole injection layer 17.

The openings 150 are configured to partition a light emission region into light emission sub-regions corresponding to respective pixels (the organic EL devices 10R, 10G, and 10B). Examples of a planar shape of each of the openings 150 may include, but not limited to, a rectangular shape, a square shape, and a circular shape. The hole injection layer 17, the organic layer 18, and the second electrode 19 are formed as common layers for the organic EL devices 10R, 10G, and 10B, and are formed not only in the openings 150 of the insulating layer 15 but also regions other than the openings 150 (regions between pixels). However, light is emitted only from portions facing the openings 150 of the insulating layer 15.

In this embodiment, at the edge of each of the openings 150, the second insulating layer 15B projects over from an end edge e1 of the first insulating layer 15A to inside of the opening 150, and an projecting portion of the second insulating layer 15B is the overhang 16. In other words, at the edge of each of the openings 150, the first insulating layer 15 is formed so as to position the end edge e1 thereof behind an end edge e2 of the second insulating layer 15B. At the overhang 16, at least the hole injection layer 17 is cut or has higher resistance (a region A illustrated in FIG. 4A).

The height h of the overhang 16 may be preferably within a range of about 10 nm to about 50 nm both inclusive, and is equal to the thickness of the first insulating layer 15A in this case. The height h may be preferably set to a smallest possible value capable of cutting the hole injection layer 17 in terms of flatness that will be described later. The width d of the overhang 16 may be preferably within a range of, for example, about 5 nm to about 50 nm both inclusive. However, the height h and the width d (an aspect ratio) of the overhang 16 is not limited to the above-described values, and may be set to values capable of cutting the hole injection layer 17, based on thicknesses, materials, and etching conditions of the first insulating layer 15A and the second insulating layer 15B, a width of the opening 150, a material, a thickness, and the like of the hole injection layer 17.

It is to be noted that a layer cut by the overhang 16 is not limited to the hole injection layer 17, and may be a part or a whole of the organic layer 18. For example, two layers, i.e., the hole injection layer 17 and a hole transport layer 18A may be cut, and the other layers of the organic layer 18 may be continuously formed. Moreover, for example, compared to the top emission type display unit, a so-called bottom emission type display unit has less restrictions on the material and the thickness of the second electrode; therefore, flexibility of a layer to be cut is high, and, for example, the hole injection layer 17 and all layers of the organic layer 18 may be cut.

Moreover, in a case where the hole injection layer 17 is not formed, at least the hole transport layer 18A of the organic layer 18 on the first electrode 14 may be cut.

Further, the hole injection layer 17 may be preferably in an entirely cut state (a discontinuous state) at the overhang 16, but is not limited thereto, and as long as the hole injection layer 17 is in a sufficiently high resistance state, the hole injection layer 17 may be continuously formed in part only or with an extremely thin thickness.

Furthermore, a space S is formed between the second insulating layer 15B and the first electrode 14 by the overhang 16; however, a part of the hole injection layer 17 and a part of the organic layer 18 may be formed in the space S, or the space S may be filled with the organic layer 18.

Figure 4B:
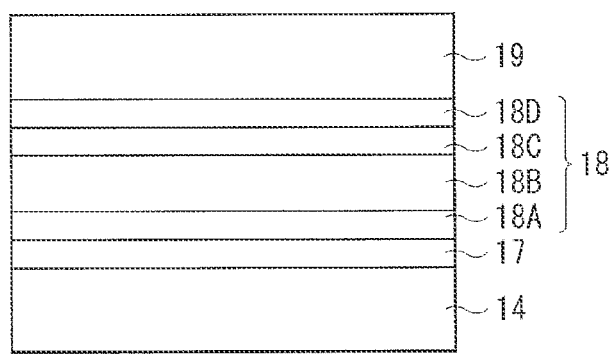
FIG. 4B is a schematic sectional view illustrating a laminate configuration of an organic EL device illustrated in FIG. 3.

The hole injection layer 17 and the organic layer 18 has an identical laminate configuration in the organic EL devices 10R, 10G, and 10B irrespective of colors of light emitted from the organic EL devices 10R, 10G, and 10B. FIG. 4B illustrates the laminate configuration of each of the organic EL devices 10R, 10G, and 10B. The organic layer 18 may have, for example, a configuration in which the hole transport layer (HTL) 18A, the light-emitting layer 18B, an electron transport layer (ETL) 18C, and an electron injection layer (EIL) 18D are laminated in this order from the hole injection layer 17. The hole injection layer 17, the organic layer 18, and the second electrode 19 are allowed to be successively and collectively formed by forming the common light-emitting layer for all pixels in a solid film form instead of forming (pattern-forming) light-emitting layers for respective pixel for color-coding. Moreover, such a configuration may be applicable to, for example, an extremely small display unit with high resolution in which an angle of field is several inches or less and a pixel pitch is several tens of micrometers. It is to be noted that, in this case, all of the layers of the organic layer 18 are formed without being cut at a boundary between pixels (by the overhang 16). However, the configuration is not limited thereto, and some or all of the layers of the organic layer 18 may be cut at the boundary between pixels (by the overhang 16).

The hole injection layer 17 is a buffer layer to enhance hole injection efficiency and to prevent leakage, and may have, for example, a thickness of about 2 nm to about 10 nm both inclusive. As will be described in detail later, the hole injection layer 17 is formed on an entire surface of the substrate 11 in a so-called solid film form without being patterned in a manufacturing process; however, the hole injection layer 17 is cut or has higher resistance by the overhang 16 as described above. The hole injection layer 17 may be made of, for example, a hexaazatriphenylene derivative represented by Chem. 1 or Chem. 2.

[Chem. 1]

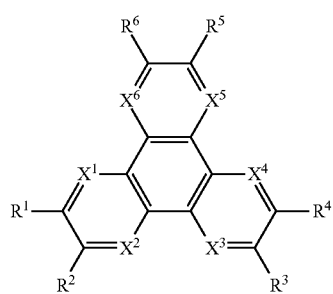

where $R^1$ to $R^6$ each are independently a substituted group selected from a group configured of hydrogen, a halogen, a hydroxyl group, an amino group, an arylamine group, a substituted or unsubstituted carbonyl group with 20 or less carbon atoms, a substituted or unsubstituted carbonyl ester group with 20 or less carbon atoms, a substituted or unsubstituted alkyl group with 20 or less carbon atoms, a substituted or unsubstituted alkenyl group with 20 or less carbon atoms, a substituted or unsubstituted alkoxyl group with 20 or less carbon atoms, a substituted or unsubstituted aryl group with 30 or less carbon atoms, a substituted or unsubstituted heterocyclic group with 30 or less carbon atoms, a nitrile group, a cyano group, a nitro group, and a silyl group, and adjacent groups $R^m$, where m=1 to 6, may be joined together through a cyclic structure, and $X^1$ to $X^6$ each are independently a carbon atom or a nitrogen atom.

[Chem. 2]

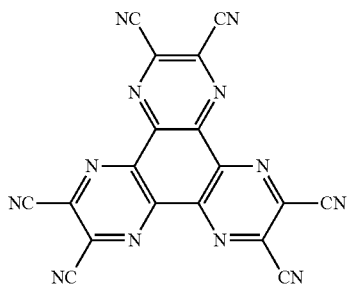

The hole transport layer 18A is configured to enhance hole transport efficiency to the light-emitting layer 18B. The light-emitting layer 18B emits light by the recombination of electrons and holes in response to the application of an electric field. The electron transport layer 18C is configured to enhance electron transport efficiency to the light-emitting layer 18B. The electron injection layer 18D is configured to enhance electron injection efficiency to the light-emitting layer 18B.

For example, the hole transport layer 18A may have a thickness of about 40 nm, and may be made of 4,4',4"-tris(3-methylphenylphenylamino)triphenylamine (m-MTDATA) or α-naphthyl phenyl diamine (αNPD).

The light-emitting layer 18B is a light-emitting layer emitting white light by color mixing, and may have, for example, a configuration in which a red light-emitting layer, a green light-emitting layer, and a blue light-emitting layer that will be described below are laminated. However, as long as the light-emitting layer 18B emits white light, the light-emitting layer 18D is not limited to such a laminate configuration, and may have, for example, a configuration in which a blue light-emitting layer and a yellow light-emitting layer are laminated, or a configuration in which a blue light-emitting layer and an orange light-emitting layer are laminated.

The red light-emitting layer emits red light by the recombination of some of holes injected from the first electrode 14 and some of electrons injected from the second electrode 19 in response to the application of an electric field. Such a red light-emitting layer may include, for example, one or more kinds selected from a red light-emitting material, a hole transport material, an electron transport material, a both-charge transport material. The red light-emitting material may be a fluorescent material or a phosphorescent material. In this embodiment, for example, the red light-emitting layer may have a thickness of about 5 nm, and may be made of 4,4'-bis(2,2-diphenylvinyl)biphenyl (DPVBi) mixed with 30 wt % of 2,6-bis[(4'-methoxydiphenylamino)styryl]-1,5-dicyanonaphthalene (BSN).

The green light-emitting layer is configured to emit green light by the recombination of some of holes injected from the first electrode 14 and some of electrons injected from the second electrode 19 in response to the application of an electric field. Such a green light-emitting layer may include, for example, one or more kinds selected from a green light-emitting material, a hole transport material, an electron transport material, and a both-charge transport material. The green light-emitting material may be a fluorescent material or a phosphorescent material. In this embodiment, for example, the green light-emitting layer may have a thickness of about 10 nm, and may be made of DPVBi mixed with 5 wt % of Coumarin6.

The blue light-emitting layer is configured to emit blue light by the recombination of some of holes injected from the first electrode 14 and some of electrons injected from the second electrode 19 in response to the application of an electric field. Such a blue light-emitting layer may include, for example, one or more kinds selected from a blue light-emitting material, a hole transport material, an electron transport material, and a both-charge transport material. The blue light-emitting material may be a fluorescent material or a phosphorescent material. In this embodiment, for example, the blue light-emitting layer may have a thickness of about 30 nm, and may be made of DPVBi mixed with 2.5 wt % of 4,4′-bis[2-{4-(N,N-diphenylamino)phenyl}yinyl]biphenyl (DPAVBi).

For example, the electron transport layer 18C may have a thickness of about 20 nm, and may be made of tris(8-hydroxyquinoline) aluminum (Alq3).

For example, the electron injection layer 18D may have a thickness of about 0.3 nm, and may be made of LiF, $Li_2O$, or the like.

As will be described later, each of the organic EL devices 10R, 10G, and 10B has a resonance configuration in which the organic layer 18 is used as a resonance section. Since a distance from a light emission point to a reflective surface is appropriately adjustable, the organic layer 18 may preferably have a film thickness of about 80 nm to about 500 nm both inclusive, and more preferably a film thickness of about 150 nm to about 350 nm both inclusive.

The second electrode 19 is formed on an entire surface of the organic layer 18 to be put over all of the organic EL devices 10R, 10G, and 10B. The second electrode 19 may be configured of one of single-layer films of ITO, IZO, ZnO, InSnZnO, an MgAg alloy, Ag, and the like, or a laminate film including two or more kinds selected from the single-layer films. It is to be noted that, in a case of the bottom emission type display unit, materials similar to those listed as the material of the above-described first electrode 14 may be used for the second electrode 19.

The protective layer 20 may be made of silicon nitride, silicon oxide, a metal oxide, or the like. The adhesive layer 21 may be made of, for example, a thermosetting resin or an ultraviolet curable resin.

The sealing substrate 23 may be made of a material such as glass transparent to light emitted from the organic EL devices 10R, 10G, and 10B, and the color filter layer 22 is formed on one surface of the sealing substrate 23.

The color filter layer 22 is configured to extract white light emitted from each of the organic EL devices 10R, 10G, and 10B as red light, green light, or blue light in each pixel. The color filter layer 22 may include, for example, a red filter layer 22R facing the organic EL device 10R, a green filter layer 22G facing the organic EL device 10G, and a blue filter layer 22B facing the organic EL device 10B. Moreover, a light-shielding layer BM is formed in regions between the red filter layer 22R, the green filter layer 22G, and the blue filter layer 22B, i.e., regions between pixels. The light-shielding layer BM may be formed as necessary, and may not be formed.

The color filter layer 22 may be provided to any one of a light-incident surface (located closer to the device) and a light-exit surface of the sealing substrate 21; however, the color filter layer 22 may be preferably provided to the light-incident surface of the sealing substrate 21, because the color filter layer 22 is not exposed to a surface, and is allowed to be protected by the adhesive layer 21. Moreover, since a distance between the light-emitting layer 18B and the color filter layer 22 is narrowed, light emitted from the light-emitting layer 18B is allowed to be prevented from entering an adjacent filter layer of another color to cause color mixing.

For example, the above-described display unit 1 may be manufactured as follows. FIGS. 5 to 10 illustrate an example of processes of manufacturing the display unit 1 according to this embodiment.

[Manufacturing Method]

Figure 5:
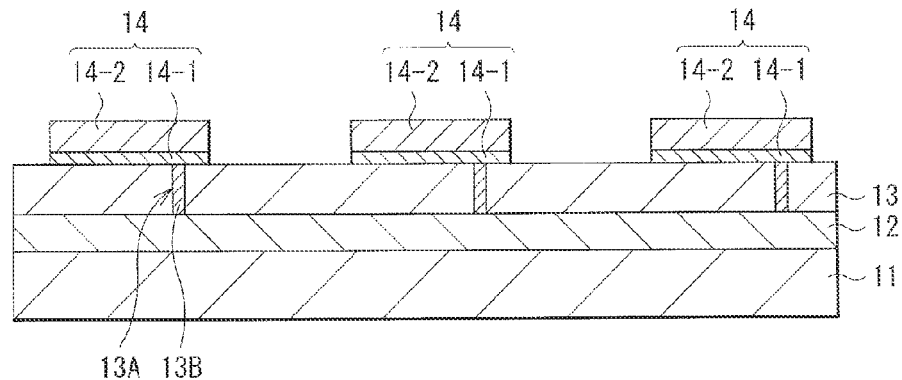
FIG. 5 is a sectional view for describing a method of manufacturing the display unit illustrated in FIG. 3.

First, as illustrated in FIG. 5, the drive circuit layer 12 including the pixel drive circuit 140 is formed on the substrate 11 made of the above-described material by a known MOS process, and then, an entire surface of the drive circuit layer 12 is coated with, for example, a photopolymer as an organic material of the above-described materials of the planarization layer 13. The photopolymer is exposed and developed, and then is patterned into a predetermined shape to form the planarization layer 13. The connection hole 13A is formed simultaneously with patterning, and then a conductive material is embedded in the connection hole 13A to form the plug 13B.

After that, the metal layers 14-1 and 14-2 made of, for example, the above-described materials are formed in this order by, for example, a sputtering method, and then, for example, wet etching is performed to form the first electrodes 14 separated for the respective organic EL devices 10R, 10G, and 10B (respective pixels).

Figure 6A:
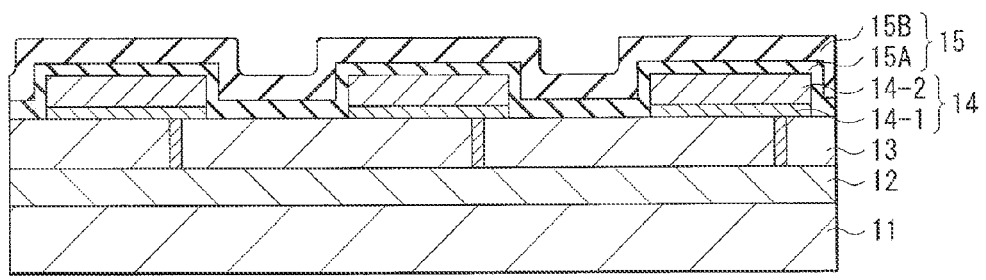
FIG. 6A is a sectional view illustrating a process following FIG. 5.

Next, the insulating layer 15 including the above-described opening 150 and the above-described overhang 16 is formed. More specifically, first, as illustrated in FIG. 6A, the first insulating layer 15A and the second insulating layer 15B are laminated in this order on the entire surface of the substrate 11. At this time, for example, a film of SiON or SiN as the first insulating layer 15A and, for example, a film of $SiO_2$ as the second insulating layer 15B are formed by, for example, a CVD (Chemical Vapor Deposition) method so as to have the above-described thicknesses.

Figure 6B:
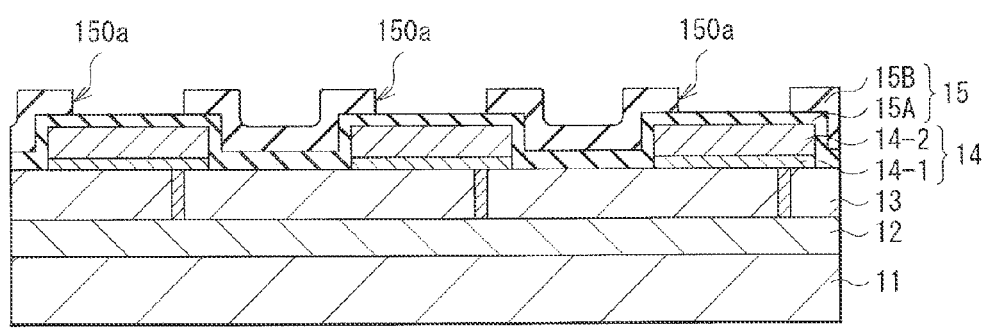
FIG. 6B is a sectional view illustrating a process following FIG. 6A.

Next, as illustrated in FIG. 6B, only the second insulating layer 15B of the first insulating layer 15A and the second insulating layer 15B that are laminated is selectively removed by etching with use of, for example, a photolithography method to form an opening 150a in the second insulating layer 15B. More specifically, formation of a film of a photoresist (not illustrated) and exposure (patterning) are performed on the second insulating layer 15B. After that, the second insulating layer 15B is processed to a surface of the first insulating layer 15A with use of a condition allowed to obtain etching selectivity between the first insulating layer 15A and the second insulating layer 15G by, for example, anisotropic (or isotropic) dry etching (or wet etching). After the second insulating layer 15B is processed, the photoresist is removed.

Figure 6C:
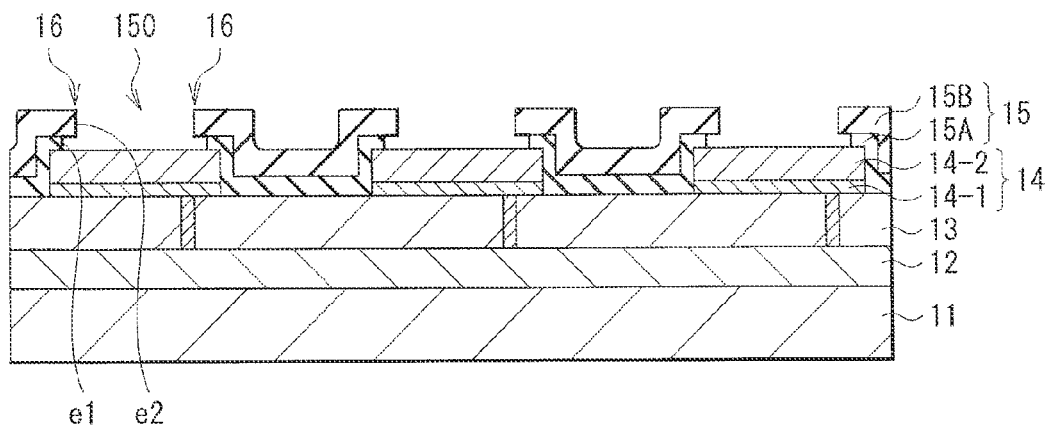
FIG. 6C is a sectional view illustrating a process following FIG. 6B.

Next, as illustrated in FIG. 6C, an exposed portion of the first insulating layer 15A is selectively removed to form the opening 150. At this time, the first insulating layer 15A is processed to a surface of the first electrode 14 with use of a condition allowed to obtain etching selectivity between the first insulating layer 15A and the second insulating layer 15B by, for example, isotropic dry etching or isotropic wet etching. Thus, while the opening 150 is formed, the overhang 16 is allowed to be formed at the edge of the opening 150 by positioning the end edge e1 of the first insulating layer 15A behind the end edge e2 of the second insulating layer 15B.

Figure 7:
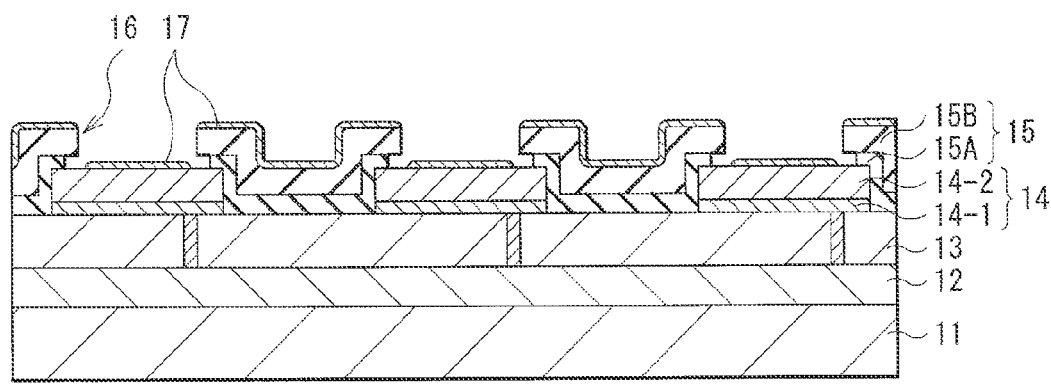
FIG. 7 is a sectional view illustrating a process following FIG. 6C.

After that, as illustrated in FIG. 7, the hole injection layer 17 made of the above-described material with the above-described thickness is formed on the entire surface of the substrate 11 by, for example, a vacuum deposition method, a sputtering method, or a coating method such as a spin coating method or a die coating method. At this time, the hole injection layer 17 is formed in a state in which the hole injection layer 17 is cut by the overhang 16 formed at the opening 150 of the insulating layer 15 or in a state in which the hole injection layer 17 is continuously formed in part only or with an extremely thin film by the overhand 16. Thus, in this embodiment, the hole injection layer 17 is allowed to be formed separately for each first electrode 14 (each pixel, or each of the organic EL devices 10R, 10G, and 10B) by the overhang 16 without being patterned.

Figure 8:
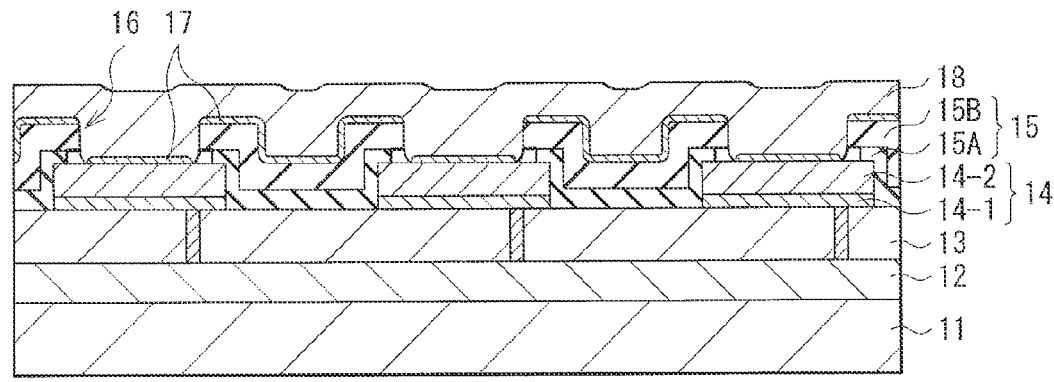
FIG. 8 is a sectional view illustrating a process following FIG. 7.

Next, as illustrated in FIG. 8, the organic layer 18 is formed by, for example, a vacuum deposition method, a sputtering method, or a coating method such as a spin coating method or a die coating method. More specifically, the hole transport layer 18A, the light-emitting layer 18B, the electron transport layer 18C, and the electron injection layer 18D made of the above-described materials are formed in this order on the hole injection layer 17. At this time, a part (for example, the above-described hole transport layer 18A) of the organic layer 18 may be cut by the overhang 16; however, in this case, a state in which the entire organic layer 18 is continuously formed without being cut is illustrated.

Figure 9:
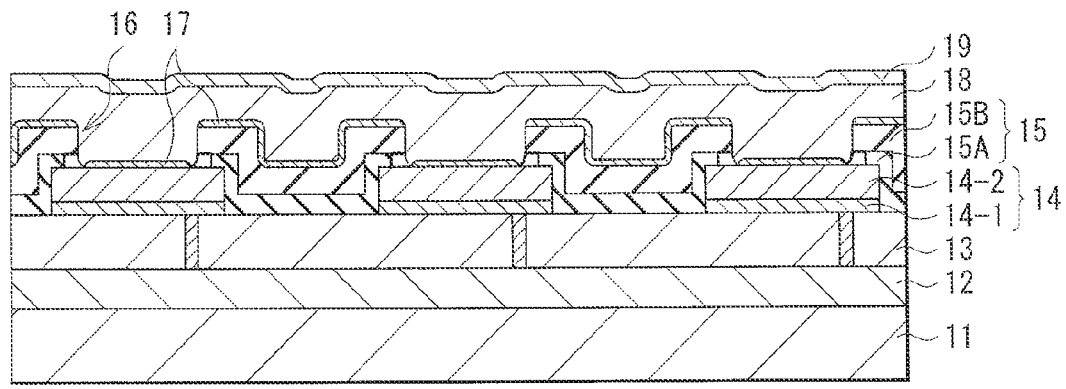
FIG. 9 is a sectional view illustrating a process following FIG. 8.

Next, as illustrated in FIG. 9, the second electrode 19 made of the above-described material is formed on the entire surface of the substrate 11 by, for example, a vacuum deposition method, a sputtering method, or the like. Thus, the hole injection layer 17, the organic layer 18, and the second electrode 19 are allowed to be successively formed on the first electrode 14 in, for example, a vacuum atmosphere. Moreover, a device configuration in which the hole injection layer 17, the organic layer 18, and the second electrode 19 are formed not only in regions directly above the first electrodes 14 but also in regions between adjacent first electrodes 14 (between pixels) is formed. Thus, the organic EL devices 10R, 10G, and 10B are formed.

Figure 10:
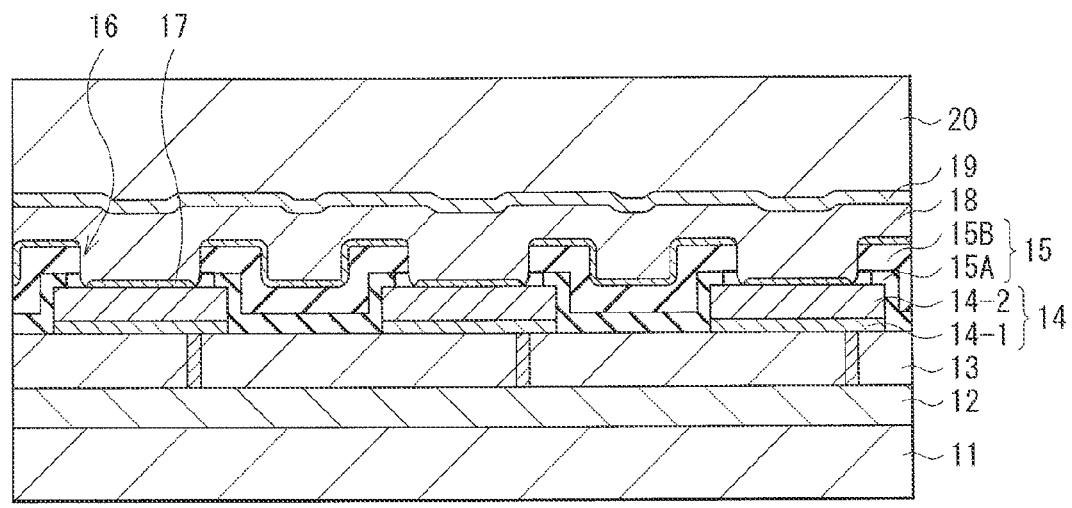
FIG. 10 is a sectional view illustrating a process following FIG. 9.

Next, as illustrated in FIG. 10, the protective layer 20 made of the above-described material is formed on the organic EL devices 10R, 10G, and 10B by, for example, a CVD method or a sputtering method.

Finally, the sealing substrate 21 is bonded to the protective layer 20 with the adhesive layer 21 in between. At this time, the color filter layer 22 is formed on the sealing substrate 21, and the sealing substrate 21 is bonded so as to allow a surface where the color filter layer 22 is formed of the sealing substrate 21 to face the organic EL devices 10R, 10G, and 10B. Thus, the display unit 1 illustrated in FIGS. 1 to 3 is completed.

[Functions and Effects]

In the display unit 1 according to this embodiment, a scanning signal is supplied from the scanning line drive circuit 130 to the gate electrode of the write transistor Tr2 in each pixel, and an image signal is supplied from the signal line drive circuit 120 to a retention capacitor Cs through the writing transistor Tr2. On/off of the drive transistor Tr1 is controlled, based on a signal supplied to and retained in the retention capacitor Cs to inject a drive current Id to each of the organic EL devices 10R, 10G, and 10B. Holes and electrons are recombined by injecting the drive current Id into the light-emitting layer 18B of the organic layer 18 through the first electrodes 14 and the second electrode 19 to cause light emission.

When, for example, white light is emitted from the light-emitting layer 18B in such a manner, the white light is repeatedly reflected between the first electrode 14 and the second electrode 19, and is extracted through the second electrode 19, the color filter layer 22, and the sealing substrate 21. More specifically, the white light having been emitted from the organic layer 18 (the light-emitting layer 18B) and having passed through the second electrode 19 is separated into, for example, light of colors RGB by the color filter layer 22. In other words, red light, green light, and blue light of the above-described white light selectively pass through the red filter layer 22R in the organic EL device 10R, the green filter layer 22G in the organic EL device 10G, and the blue filter layer 22B in the organic EL device 10B, respectively. Thus, an image is displayed with use of a combination of the organic EL devices 10R, 10G, and 10B emitting light of colors R, G, and B as one pixel.

It is to be noted that, in the above-described top emission type display unit 1, light emitted from the light-emitting layer 18B is not blocked by a TFT or the like provided to the drive circuit layer 12; therefore, the top emission type display unit 1 is superior in light extraction efficiency to the bottom emission type display unit.

In this case, as described above, in the display unit 1, the organic layer 18 includes the common light-emitting layer 18B for all pixels. Moreover, the hole injection layer 17, the organic layer 18, and the second electrode 19 are successively formed in a solid film form without being patterned for each pixel.

In this case, in the device configuration including such a common light-emitting layer 18B for all pixels, the overhang 16 is disposed at the edge of the opening 150 of the insulating layer 15, and the hole injection layer 17 is cut or has higher resistance by the overhang 16. In other words, when the overhang 16 is provided to the insulating layer 15, while the hole injection layer 17, the organic layer 18, and the second electrode 19 are successively formed into the solid film form on the first electrode 14, the hole injection layer 17 is electrically blocked at a boundary between adjacent pixels.

As described above, in the display unit 1 according to this embodiment, the insulating layer 15 having the opening 150 that faces the first electrode 14 provided to each pixel is included, and the overhang 16 is provided to the edge of the opening 150; therefore, the hole injection layer 17 is allowed to be electrically blocked at a boundary between the pixels. Accordingly, in the device configuration including the common light-emitting layer for all pixels, current leakage is allowed to be reduced.

Moreover, charge injection efficiency (in this case, hole injection efficiency) is enhanced by reducing the current leakage, and light emission efficiency is allowed to be enhanced accordingly. Further, since current leakage to adjacent pixels is reduced, color mixing is allowed to be reduced. In addition, light emission (edge light emission) from the organic layer 18 formed around an edge (a pixel end) of the opening 150 of the insulating layer 15 is allowed to be reduced to reduce deterioration in luminance Further, since current leakage in the hole injection layer 17 is allowed to be reduced, the thickness of the hole injection layer 17 is allowed to be increased; therefore, enhancement of hole injection efficiency, and by extension to light emission efficiency is achievable.

On the other hand, the second electrode 19 is an electrode connecting all of the pixels to one another; therefore, it is ideal that the second electrode 19 does not have disconnection and has low resistance. To do so, a surface where the second electrode 19 is formed (i.e., a surface of the organic layer 18) may preferably have a shape with less projections and less depressions, and has high flatness, because a difference in level in a shape with projections and depressions may cause disconnection of the second electrode 19, and local reduction in film thickness that causes an increase in resistance. In this embodiment, the insulating layer 15 is formed as a laminate film of the first insulating layer 15A and the second insulating layer 15B, and two stages of etching, i.e., anisotropic etching and isotropic etching are performed on the laminate film; therefore, while the opening 150 is formed, the overhang 16 is allowed to be formed. Accordingly, the hole injection layer 17 is allowed to be cut without forming a large difference in level on the surface of the insulating layer 15. Therefore, the device configuration having the above-described overhang 16 in this embodiment contributes to prevention of disconnection of the second electrode 19 and reduction in resistance while reducing a leak current to the hole injection layer 17.

Modification examples of the above-described first embodiment and other embodiments will be described below. In the following description, like components are denoted by like numerals as of the above-described first embodiment and will not be further described.

Modification Example 1

Figure 11:
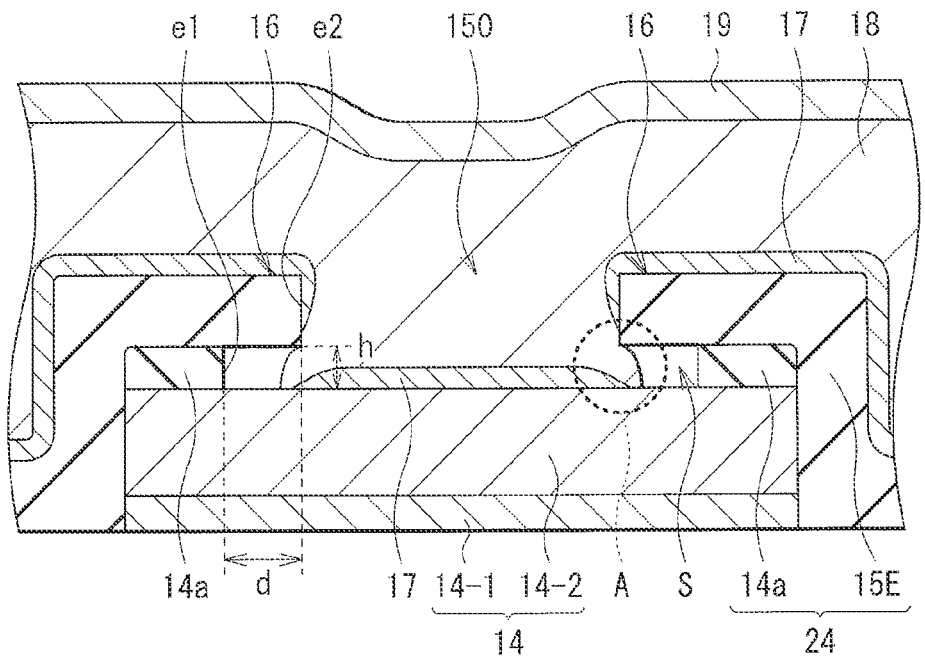
FIG. 11 is an enlarged sectional view around an opening of an insulating film of a device configuration according to Modification Example 1.

FIG. 11 illustrates a configuration around an opening of an insulating layer of a device configuration according to Modification Example 1. In the above-described first embodiment, the insulating layer 15 has a two-layer configuration including the first insulating layer 15A and the second insulating layer 15B to form the overhang 16. This modification example differs from the above-described first embodiment in that an insulating layer (an insulating layer 24) includes an etching sacrificial layer (an oxide layer 14a) formed on a surface of the first electrode 14. More specifically, in a device configuration in this modification example, the insulating layer 24 includes the oxide layer 14a formed in a part located closer to the surface of the first electrode 14 and a fifth insulating layer 15E, and the overhang 16 is formed by two stages of etching on these layers.

As with the insulating layer 15 in the above-described first embodiment, the insulating layer 24 is configured to electrically isolate the first electrodes 14 for respective pixels from one another, and to secure insulation between the first electrodes 14 and the second electrode 19. Moreover, the insulating layer 24 has the opening 150 facing each of the first electrodes 14, and the overhang 16 is formed at the edge of the opening 150.

The oxide layer 14a is made of an oxide of metal forming the surface of the first electrode 14, and has a thickness substantially equal to that of the first insulating layer 15A in the above-described first embodiment. For example, in a case where the metal layer 14-2 in the first electrode 14 is made of aluminum, the oxide layer 14a is made of aluminum oxide ($Al_2O_3$). The material of the oxide layer 14a is not limited to aluminum oxide, and alternatively, the oxide layer 14a may be made of another metal oxide, for example, copper oxide ($CuO$, $Cu_2O$), titanium oxide ($TiO_2$), or the like. In this modification example, the height of the overhang 16 is determined by the thickness of the oxide layer 14a.

The fifth insulating layer 15E may be made of a material allowed to obtain etching selectivity with the metal oxide forming the oxide layer 14a selected from inorganic insulating film materials such as silicon oxide, silicon nitride, and silicon oxynitride. For example, in this embodiment, in a case where the oxide layer 14a is made of aluminum oxide, as the fifth insulating layer 15E, for example, silicon oxide or silicon oxynitride may be used. Moreover, the thickness of the fifth insulating layer 15E is substantially equal to that of the second insulating layer 15B in the above-described first embodiment. Although the thicknesses of the oxide layer 14a and the fifth insulating layer 15E are not limited, the thickness of the fifth insulating layer 15E may be preferably larger than that of the oxide layer 14a.

In this modification example, the fifth insulating layer 15E has a portion projecting over from an end edge (an inner wall S1) of the oxide layer 14a at the edge of the opening 150 of the insulating layer 24, and the projecting portion is the overhang 16. In other words, at the edge of the opening 150, the oxide layer 14a is formed so as to position the inner wall S1 thereof behind an end edge e5 of the fifth insulating layer 15E. At the overhang 16, at least the hole injection layer 17 is cut or have lower resistance (a region A illustrated in FIG. 11).

Figure 12A:
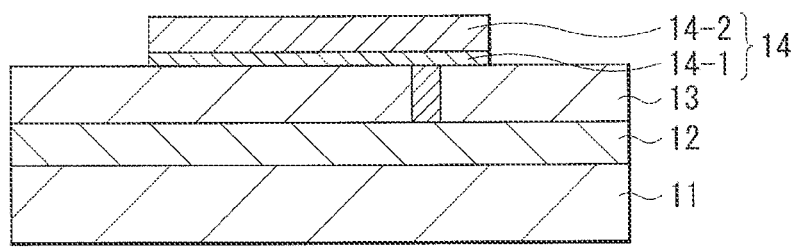
FIG. 12A is a sectional view for describing a process of forming the device configuration illustrated in FIG. 11.
Figure 12B:
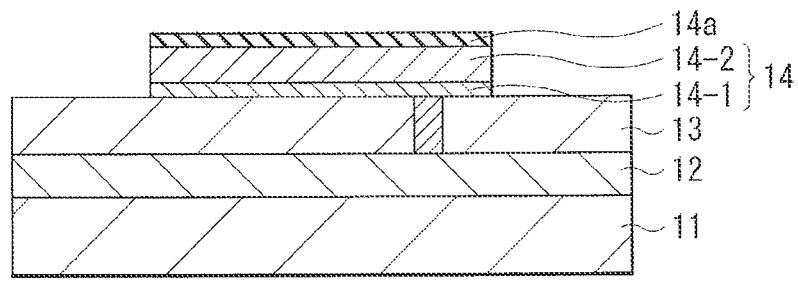
FIG. 12B is a sectional view illustrating a process following FIG. 12A.

For example, such a device configuration may be formed as follows. First, as illustrated in FIG. 12A, as with the above-described first embodiment, the drive circuit layer 12, the planarization layer 13, and the first electrodes 14 are formed on the substrate 11. After that, as illustrated in FIG. 12B, the oxide layer 14a is formed by oxidizing a portion located closer to a surface of the metal layer 14-2 (a portion from the surface of the metal layer 14-2 to, for example, a thickness of about 5 nm to about 50 nm) of the first electrode 14.

Figure 13A:
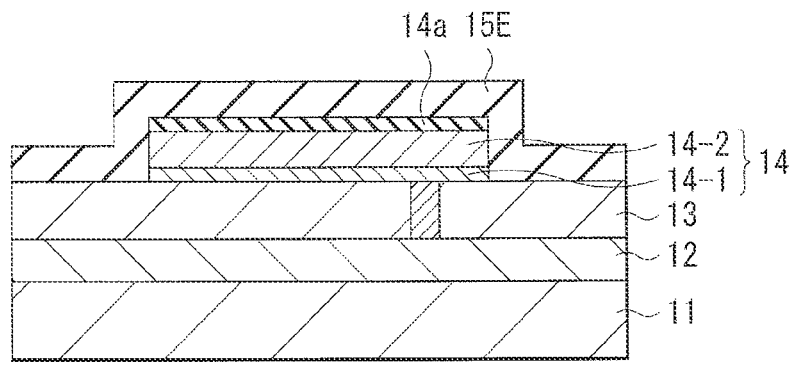
FIG. 13A is a sectional view illustrating a process following FIG. 12B.
Figure 13B:
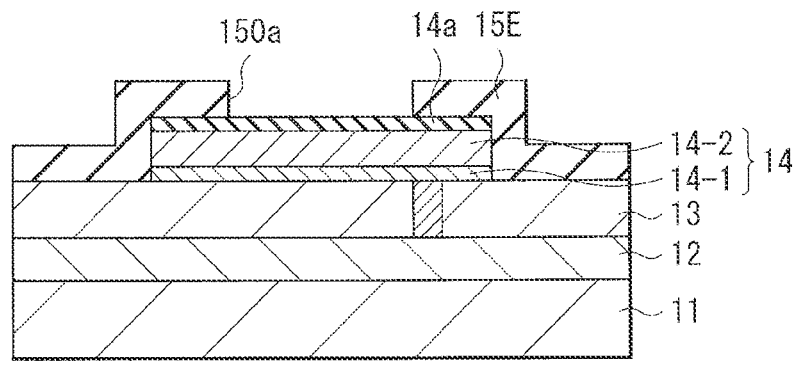
FIG. 13B is a sectional view illustrating a process following FIG. 13A.
Figure 13C:
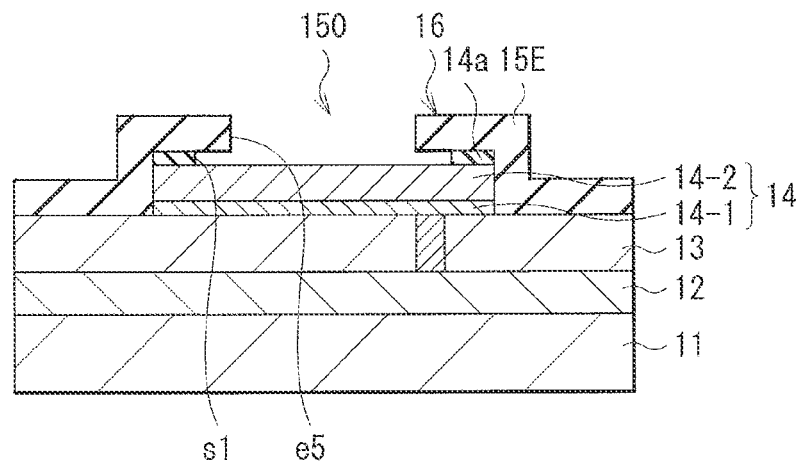
FIG. 13C is a sectional view illustrating a process following FIG. 13B.

After that, as illustrated in FIG. 13A, the fifth insulating layer 15E made of the above-described material with the above-described thickness is formed on the entire surface of the substrate 11 by, for example, a CVD method. Next, as illustrated in FIG. 13B, the opening 150a is formed in the fifth insulating layer 15E by anisotropic dry etching with use of, for example, a photolithography method. At this time, the fifth insulating layer 15E is processed to a surface of the oxide layer 14a with use of a condition allowed to obtain etching selectivity between the fifth insulating layer 15E and the oxide layer 14a by, for example, anisotropic dry etching. Next, as illustrated in FIG. 13C, the opening 150 is formed by selectively removing an exposed portion of the oxide layer 14a. At this time, the oxide layer 14a is processed to the surface of the first electrode 14 with use of the condition allowed to obtain etching selectivity between the fifth insulating layer 15E and the oxide layer 14a by, for example, isotropic dry etching or isotropic wet etching. Thus, while the opening 150 is formed, the overhang 16 is allowed to be formed at the edge of the opening 150 by positioning the inner wall s1 of the oxide layer 14a behind the end edge e5 of the fifth insulating layer 15E.

As in this modification example, the overhang 16 may be formed with use of the oxide layer 14a formed by oxidizing the surface of the first electrode 14 and the fifth insulating layer 15E formed on the oxide layer 14a, and even in such a case, effects similar to those in the above-described first embodiment are allowed to be obtained. Moreover, the overhang 16 is allowed to be formed by performing a process of oxidizing the surface of the first electrode 14 instead of a CVD process on an inorganic insulating film. Therefore, there are advantages that the number of CVD processes is allowed to be reduced, compared to the above-described first embodiment, and manufacturing processes are allowed to be simplified.

Modification Example 2

Figure 14:
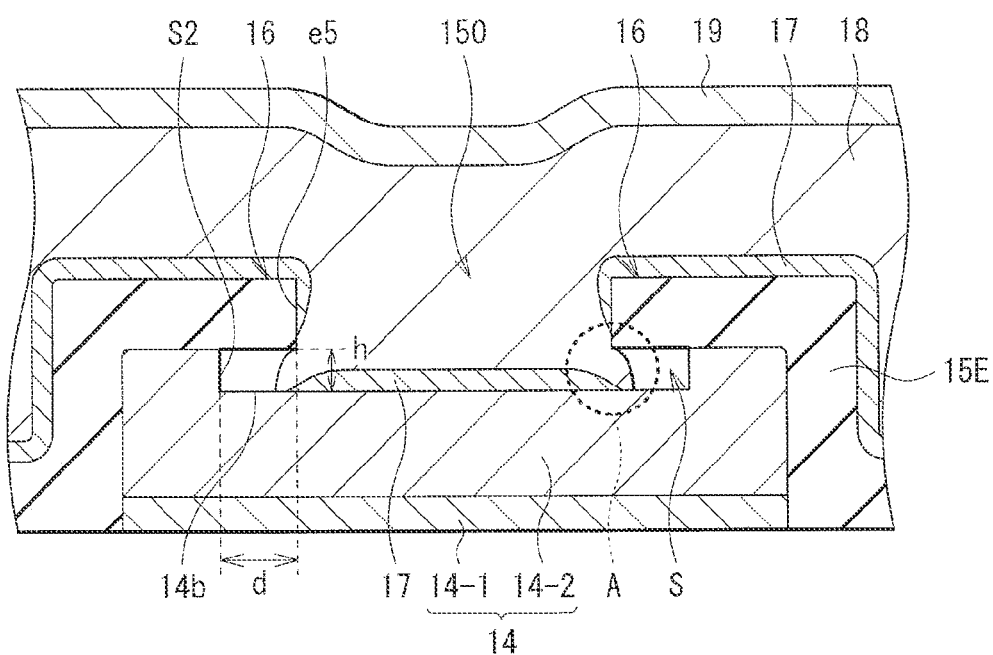
FIG. 14 is an enlarged sectional view around an opening of an insulating film of a device configuration according to Modification Example 2.

FIG. 14 illustrates a configuration around an opening of an insulating layer of a device configuration according to Modification Example 2. In the above-described Modification Example 1, the overhang 16 is formed with use of the oxide layer 14a on the surface of the first electrode 14; however, as in this modification example, the overhang 16 may be formed by directly processing the first electrode 14.

More specifically, in this modification example, a depression 14b is formed in the surface of the first electrode 14 (the surface of the metal layer 14-2), and the fifth insulating layer 15E is provided so as to overlap a part of the depression 14b on the first electrode 14. The fifth insulating layer 15 has a role similar to the above-described insulating layers 15 and 24.

In the above-described configuration, the fifth insulating layer 15E has a portion projecting over from an inner wall s2 of the depression 14b to inside of the opening 150 at the edge of the opening 150 of the fifth insulating layer 15E, and the projecting portion is the overhang 16. In other words, at the edge of the opening 150, the depression 14b is formed so as to position the inner wall s2 thereof behind the end edge e5 of the fifth insulating layer 15E. At the overhang 16, at least the hole injection layer 17 is cut or has lower resistance (the region A illustrated in FIG. 14).

Figure 15A:
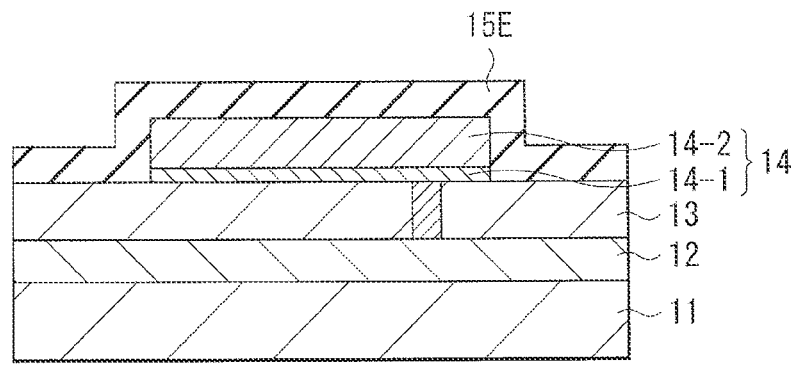
FIG. 15A is a sectional view for describing a process of forming the device configuration illustrated in FIG. 14.
Figure 15B:
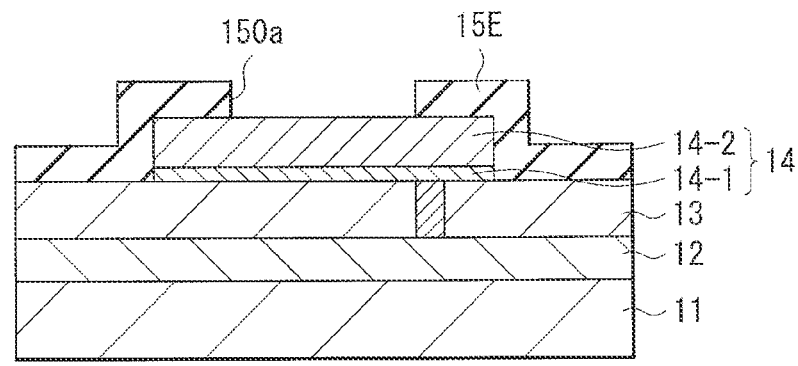
FIG. 15B is a sectional view illustrating a process following FIG. 15A.
Figure 15C:
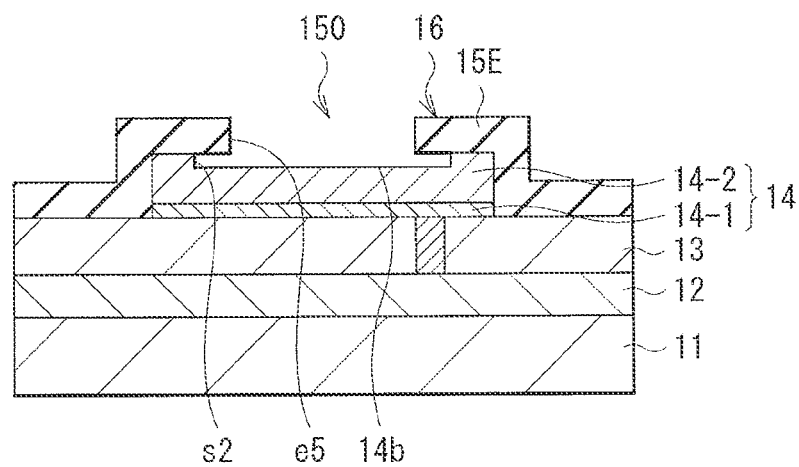
FIG. 15C is a sectional view illustrating a process following FIG. 15B.

For example, this device configuration may be formed as follows. First, as illustrated in FIG. 15A, as with the above-described first embodiment, after the drive circuit layer 12, the planarization layer 13, and the first electrodes 14 are formed on the substrate 11, as with the above-described Modification Example 1, the fifth insulating layer 15E is formed on the entire surface of the substrate 11 by, for example, a CVD method. Next, as illustrated in FIG. 15B, the opening 150a is formed in the fifth insulating layer 15E by, for example, anisotropic dry etching. At this time, the fifth insulating layer 15E is processed to the surface of the first electrode 14 with use of a condition allowed to obtain etching selectivity between the fifth insulating layer 15E and the first electrode 14 (for example, aluminum) by anisotropic dry etching with use of, for example, a photolithography method. Next, as illustrated in FIG. 15C, the opening 150 is formed by selectively removing an exposed portion located closer to the surface of first electrode 14. At this time, the first electrode 14 is processed with use of the condition allowed to obtain etching selectivity between the fifth insulating layer 15E and the first electrode 14 by, for example, isotropic wet etching. Thus, while the opening 150 is formed, the depression 14b is formed, and the overhang 16 is allowed to be formed at the edge of the opening 150 by positioning the inner wall s2 of the depression 14b behind the end edge e5 of the fifth insulating layer 15E.

Figure 16A:
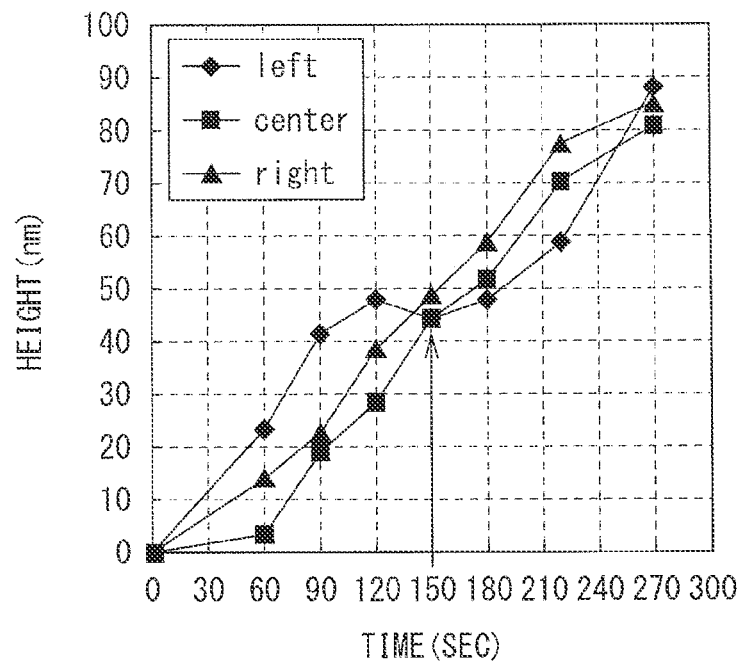
FIG. 16A is a characteristic diagram illustrating a relationship between processing time for depression formation and a height h of an overhang.
Figure 16B:
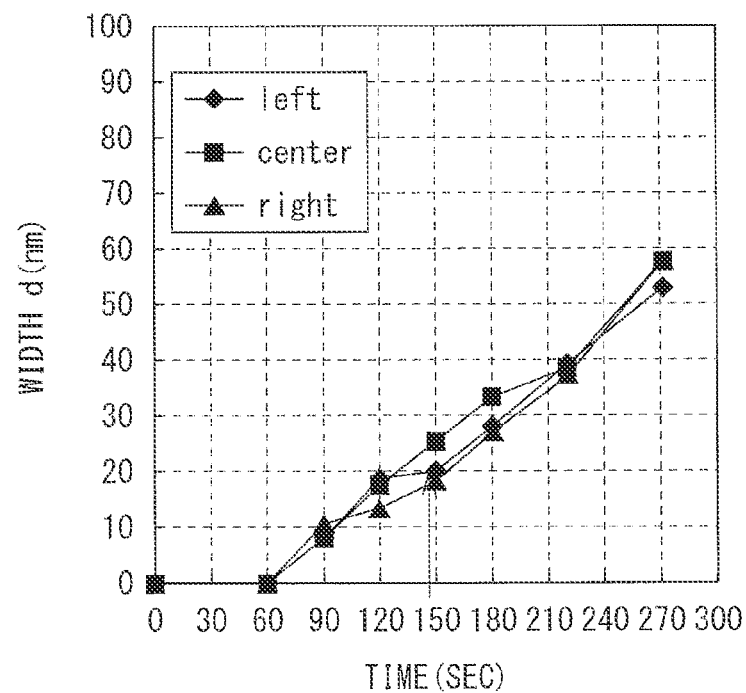
FIG. 16B is a characteristic diagram illustrating the processing time for depression formation and a width d of the overhang.

FIG. 16A illustrates a relationship between processing time (seconds) and the height h of the overhang 16 (=a depth of the depression 14b) in a case where the depression 14b is formed by processing the first electrode 14 (aluminum) by isotropic dry etching. Moreover, FIG. 16B illustrates a relationship between the above-described processing time and the width d of the overhang 16. It is to be noted that FIGS. 16A and 16B illustrate results of processing that are the same as each other, and "left", "center", and "right" in the diagrams indicate positions in a wafer plane. There is correlation between the processing time and the aspect ratio of the overhang 16, and this is applicable to not only this modification example, but also the above-described first embodiment and the like.

Second Embodiment

Configuration

Figure 17:
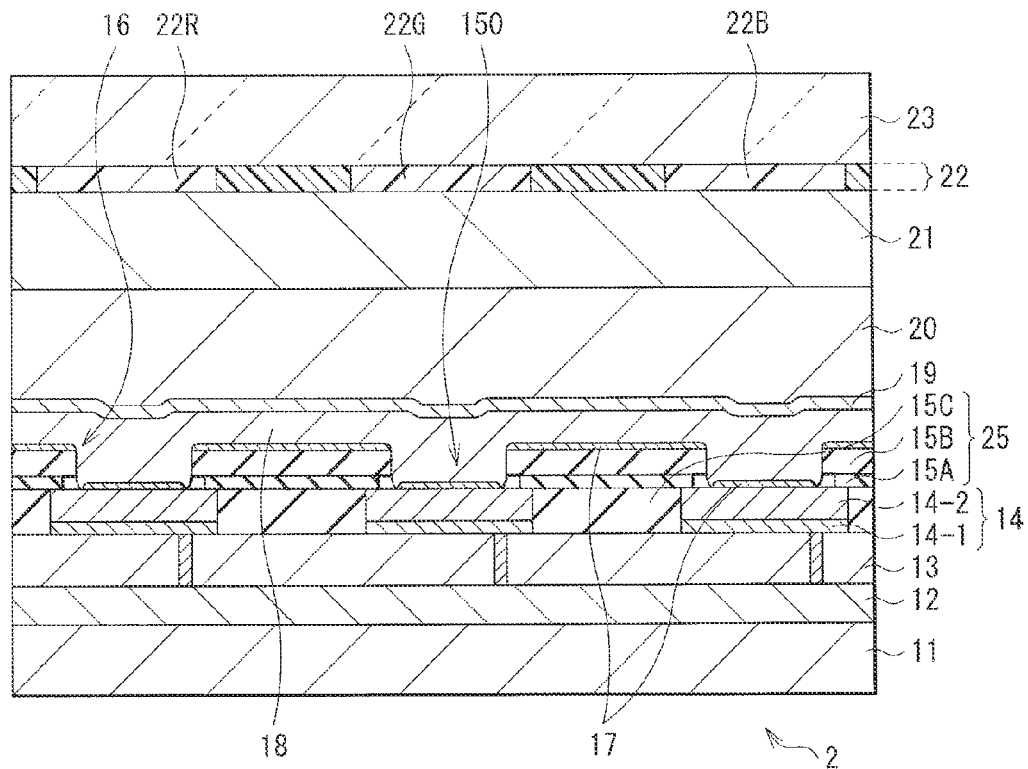
FIG. 17 is a sectional view illustrating a configuration of a display unit according to a second embodiment of the present technology.

FIG. 17 illustrates a sectional configuration of a display unit (a display unit 2) according to a second embodiment of the present technology. In the above-described first embodiment, the insulating layer 15 is configured of a laminate film of the first insulating layer 15A and the second insulating layer 15B; however, the, an insulating layer (an insulating layer 25) in this embodiment differs from the insulating layer 15 in the above-described first embodiment in that the insulating layer 25 is configured of a three-layer laminate film, and a region between pixels in the insulating layer 25 is planarized.

As with the insulating layer 15 in the above-described first embodiment, the insulating layer 25 is configured to electrically isolate the first electrodes 14 for respective pixels from one another, and to secure insulation between the first electrodes 14 and the second electrode 19. Moreover, the insulating layer 25 has the opening 150 facing each of the first electrodes 14, and the overhang 16 is formed at the edge of the opening 150.

Figure 18:
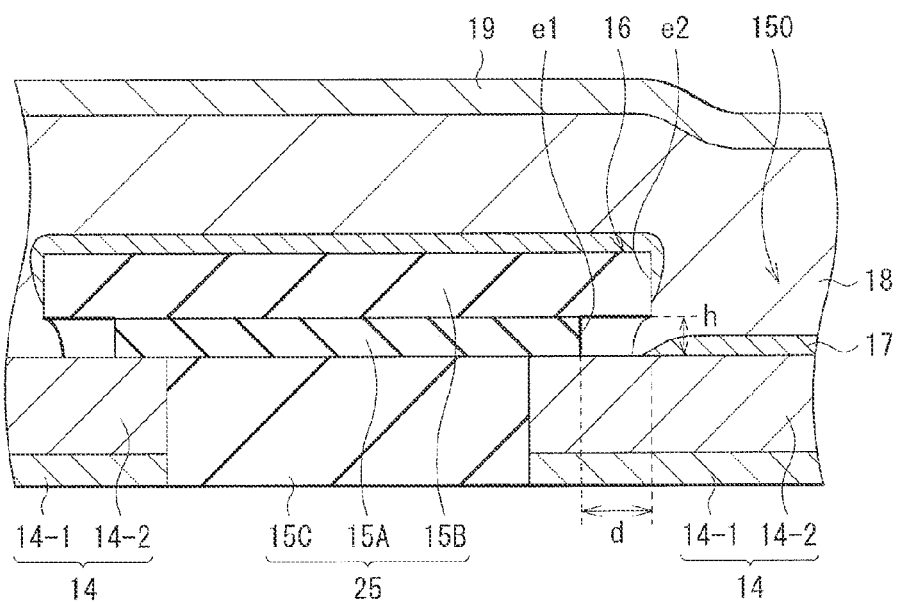
FIG. 18 is an enlarged sectional view of an opening of an insulating film and a region between pixels illustrated in FIG. 17.

FIG. 18 is an enlarged view of a configuration around the opening 150 and a region between the first electrodes 14 (between pixels). In this embodiment, a third insulating layer 15C may be embedded in, for example, a region between adjacent first electrodes 14. The first insulating layer 15A and the second insulating layer 15B that are described in the above-described first embodiment are laminated in this order on the third insulating layer 15C and the first electrodes 14, and a portion of the second insulating layer 15B forms the overhang 16. Thus, in this embodiment, the insulating layer 25 is a three-layer film configured of the first insulating layer 15A, the second insulating layer 15B, and the third insulating layer 15C. In such a configuration, in a region directly above the first electrode 14, the opening 150 and the overhang 16 are formed by performing etching similar to that in the above-described first embodiment on the first insulating layer 15A and the second insulating layer 15B. On the other hand, in a region between the first electrodes 14 (between pixels), a surface of the third insulating layer 15C is planarized to be located at a level substantially equal to the level of the surface of the first electrode 14, and the first insulating layer 15A and the second insulating layer 15B are laminated on the third insulating layer 15C. A thickness of the third insulating layer 15C is substantially equal to that of the first electrode 14. A material forming the third insulating layer 15C is not specifically limited; however, examples of the material of the third insulating layer 15C may include inorganic insulating materials such as silicon oxide, silicon nitride, and silicon oxynitride. Moreover, the third insulating layer 15C may be formed by a typical plasma CVD method, or may be a so-called HDP film formed by a high density plasma CVD method.

[Manufacturing Method]

For example, the display unit 2 may be formed as follows. FIGS. 19 to 22 illustrate an example of processes of manufacturing the display unit 2 according to this embodiment.

Figure 19:
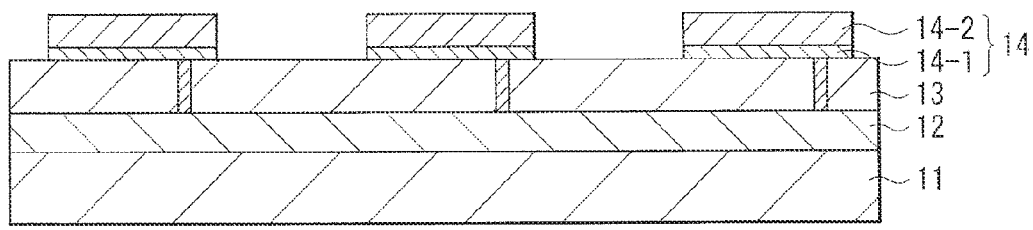
FIG. 19 is a sectional view for describing a method of manufacturing the display unit illustrated in FIG. 17.

First, as illustrated in FIG. 19, as with the above-described first embodiment, the drive circuit layer 12, the planarization layer 13, and the first electrodes 14 are formed on the substrate 11.

Figure 20A:
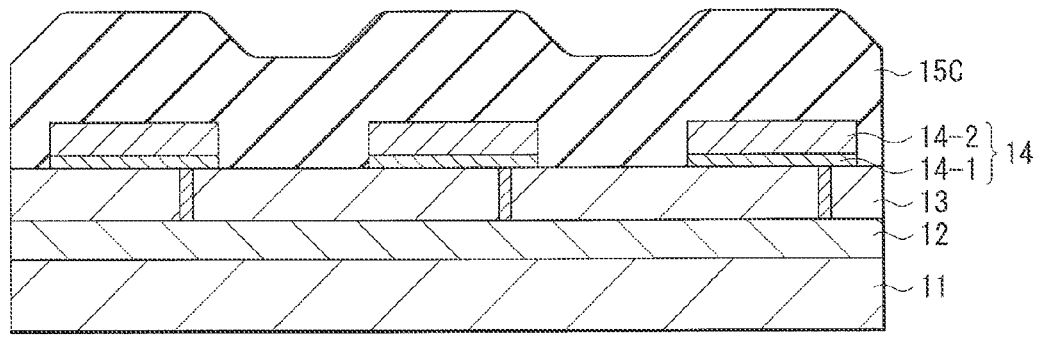
FIG. 20A is a sectional view illustrating a process following FIG. 19.

After that, the insulating layer 25 is formed. More specifically, first, as illustrated in FIG. 20A, the third insulating layer 15C made of the above-described material is formed by, for example, a CVD method or the like. At this time, the third insulating layer 15C is formed on the entire surface of the substrate 11 so as to have a thickness thick enough for the third insulating layer 15C to be embedded in a depression region between the first electrodes 14 and to be put over the first electrodes 14.

Figure 20B:
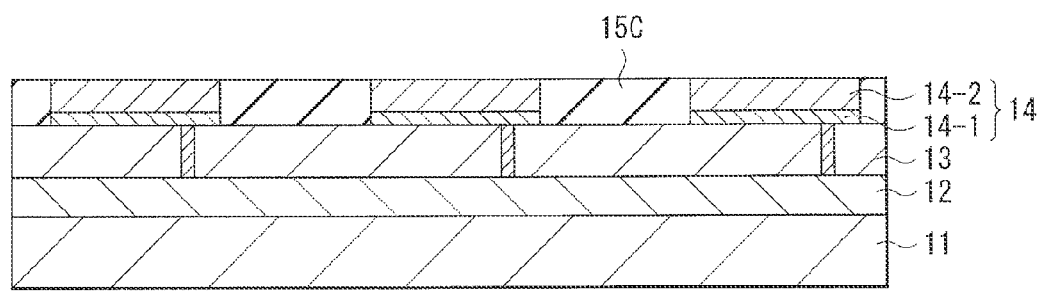
FIG. 20B is a sectional view illustrating a process following FIG. 20A.

Next, as illustrated in FIG. 20B, a surface of the third insulating layer 15C is polished by, for example, a CMP (Chemical Mechanical Polishing) method to be planarized. At this time, polishing starts from the surface (a top surface) of the third insulating layer 15C, and when a surface (a top surface) of the first electrode 14 is exposed, the polishing is finished with use of, for example, EPD (End Point Detection) or the like.

Alternatively, there is a characteristic that, in a case where the third insulating layer 15C is formed by, for example, a HDP method, flatness is obtained by forming the third insulating layer 15C with a large thickness. Therefore, for example, after, in a process in FIG. 20A, the third insulating layer 15C is formed with a thickness large enough to obtain sufficient flatness, in a process in FIG. 20B, the third insulating layer 15C may be etched back until the third insulating layer 15C has a thickness substantially equal to that of the first electrode 14.

Thus, the third insulating layer 15C is formed so as to be embedded in the region between the first electrodes 14 and to planarize the region between the first electrodes 14.

Figure 20C:
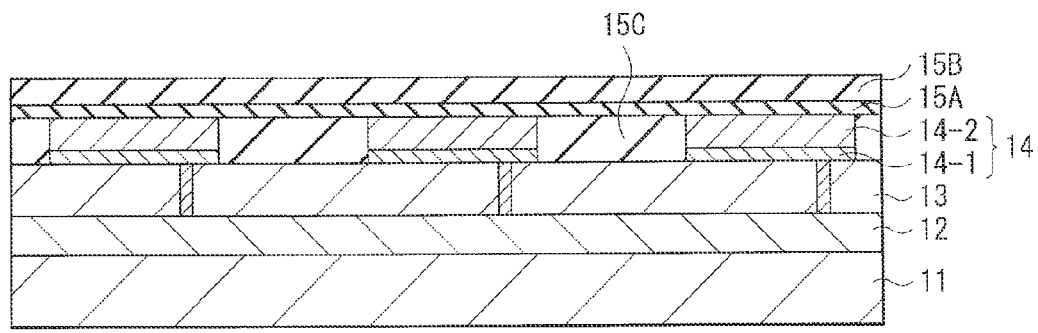
FIG. 20C is a sectional view illustrating a process following FIG. 20B.
Figure 20D:
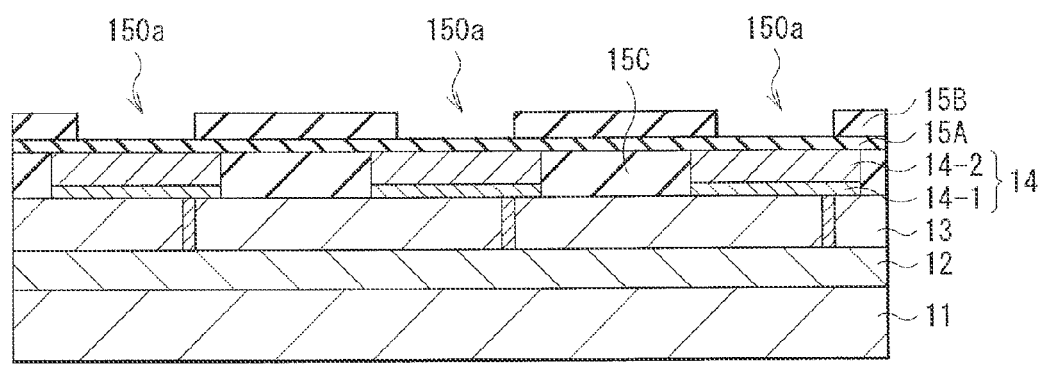
FIG. 20D is a sectional view illustrating a process following FIG. 20C.
Figure 20E:
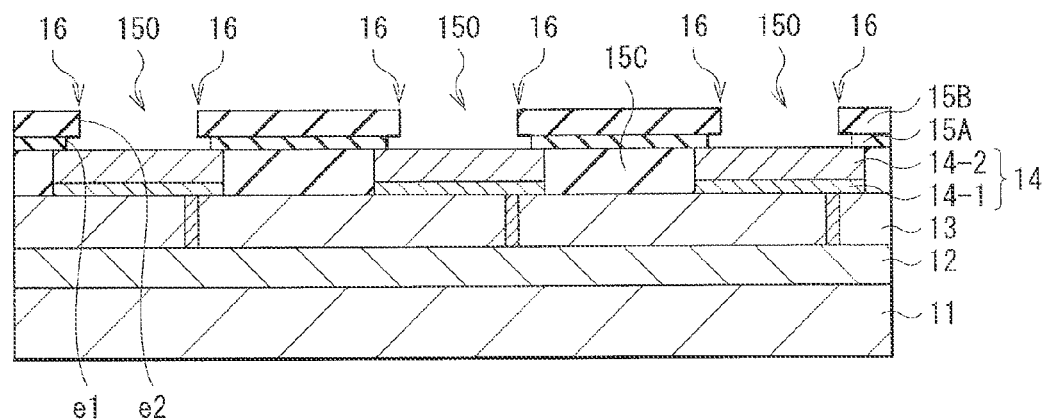
FIG. 20E is a sectional view illustrating a process following FIG. 20D.

After that, as illustrated in FIG. 20C, as with the above-described first embodiment, the first insulating layer 15A and the second insulating layer 15B are formed in this order on the entire surface of the substrate 11. Next, as illustrated in FIG. 20D, as with the above-described first embodiment, the opening 150a is formed in the second insulating layer 15B by anisotropic dry etching with use of, for example, a photolithography method. Next, as illustrated in FIG. 20E, as with the above-described first embodiment, while the opening 150 is formed by, for example, isotropic etching, the overhang 16 is formed at the edge of the opening 150.

Figure 21:
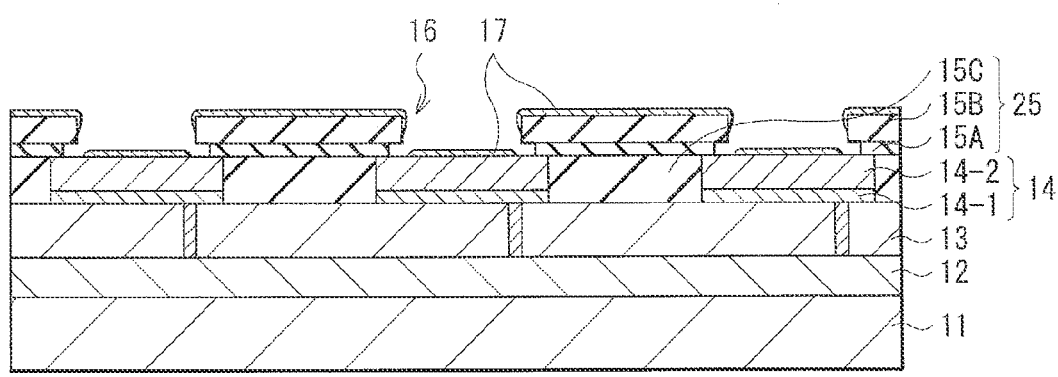
FIG. 21 is a sectional view illustrating a process following FIG. 20E.

After that, as illustrated in FIG. 21, as with the above-described first embodiment, the hole injection layer 17 is formed. Even in this embodiment, the hole injection layer 17 is allowed to be formed in a state in which the hole injection layer 17 is cut by the overhang 16 or in a state in which the hole injection layer 17 is continuously formed in part only or with an extremely thin film by the overhang 16; therefore, the hole injection layer 17 is allowed to be formed separately for each first electrode 14 without being patterned.

Figure 22:
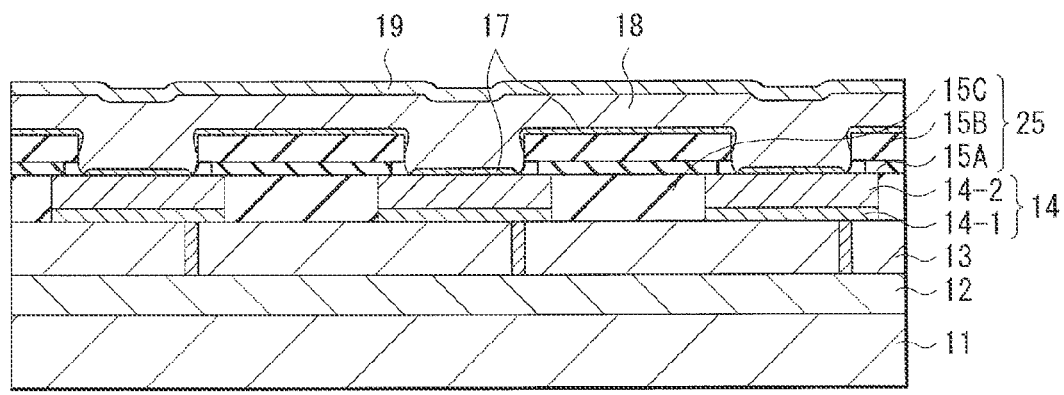
FIG. 22 is a sectional view illustrating a process following FIG. 21.

Next, as illustrated in FIG. 22, as with the above-described first embodiment, the organic layer 18 and the second electrode 19 are formed in this order. Thus, the organic EL devices 10R, 10G, and 10B are formed. Moreover, although not illustrated, as with the above-described first embodiment, after the protective layer 20 is formed, the sealing substrate 21 and the color filter layer 22 are bonded to the protective layer 20 with the adhesive layer 21 in between. Thus, the display unit 2 illustrated in FIG. 17 is completed.

As described above, even in this embodiment, the device configuration in which the hole injection layer 17, the organic layer 18, and the second electrode 19 are formed on not only the region directly above each of the first electrodes 14 but also the region between adjacent first electrodes 13 is formed. Even in such a device configuration, in this embodiment, as described above, the region between the first electrodes 14 is planarized by the insulating layer 25 (more specifically, the third insulating layer 15C); therefore, flatness of the hole injection layer 17 and the organic layer 18 continuously formed in a solid film form is improved more than in the first embodiment. Therefore, in this embodiment, a case where, for example, an MgAg alloy is evaporated in a process of forming the second electrode 19, or the like, prevention of disconnection of the second electrode 19 and reduction in resistance are achievable more easily than in the above-described first embodiment.

[Functions and Effects]

Even in the display unit 2 according to this embodiment, as with the above-described first embodiment, white light emitted from the light-emitting layer 18B of the organic layer 18 is separated into, light of colors by the color filter 22 to be extracted as color light of R, G, or B. Thus, an image is displayed. In this embodiment, in the device configuration including such a common light-emitting layer 18B for all of the pixels, the hole injection layer 17 is cut or has higher resistance by the overhang 16 provided to the opening 150 of the insulating layer 25, and is electrically blocked between the adjacent pixels. Therefore, effects similar to those in the above-described first embodiment are allowed to be obtained.

Moreover, as described above, it is ideal that flatness in the second electrode 19 is high, and in this embodiment, in the second electrode 19, flatness is high and projections and depressions are reduced; therefore, variation in film thickness caused by a difference in level is reduced. More specifically, a difference in level between the first electrodes 14 may be reduced to, for example, about 0 nm to about 70 nm. As a result, sheet resistance in the second electrode 19 is reduced, and charge (electron in this case) injection efficiency is enhanced.

On the other hand, the film thickness of the second electrode 19 is preferably as thin as possible in terms of light extraction; however, there is a possibility that resistance is increased by reduction in thickness. In this embodiment, sheet resistance is allowed to be reduced by flatness of the second electrode 19; therefore, reduction in thickness of the second electrode 19 is allowable. Accordingly, reduction in thickness is achievable without increasing resistance, thereby resulting in an improvement in light emission characteristics.

Figure 23:
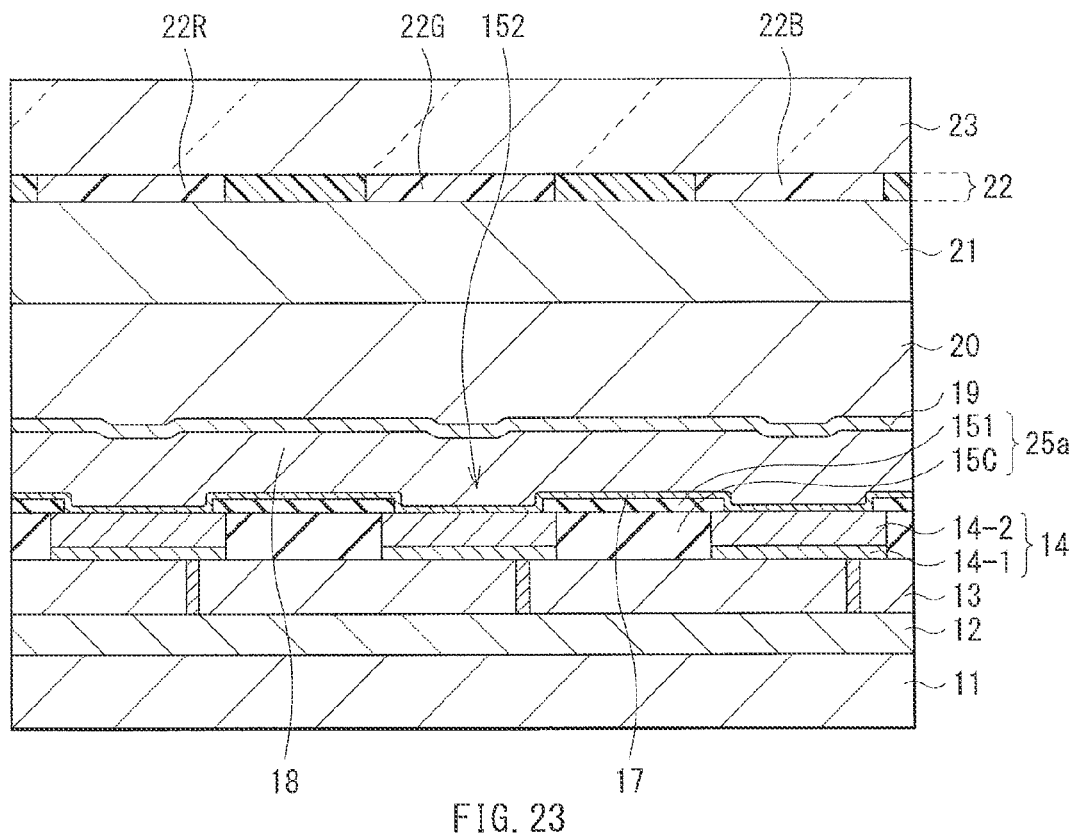
FIG. 23 is a sectional view of a display unit with a device configuration according to another modification example.
Figure 24:
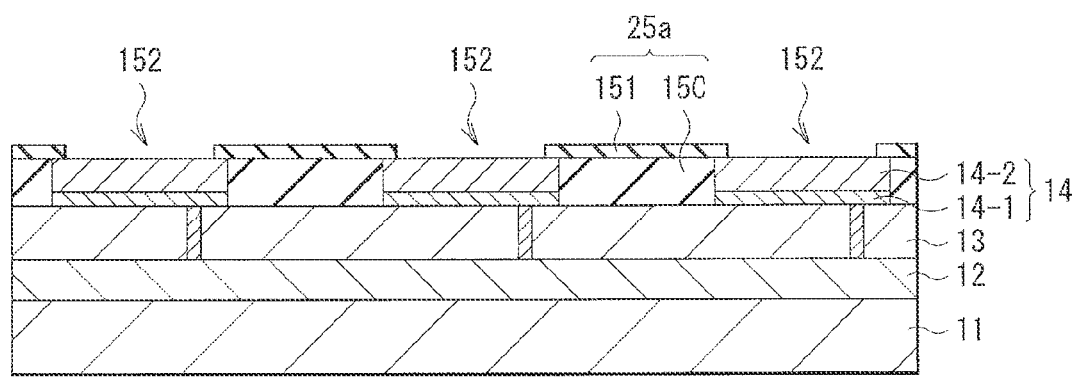
FIG. 24 is a sectional view for describing a process of forming the device configuration illustrated in FIG. 23.

It is to be noted that, in the above-described second embodiment, the device configuration in which the overhang 16 is formed in the insulating layer 25 and the region between pixels are planarized is described; however, a configuration and effects specific to a planarized portion of the insulating layer 25 in the above description are applicable to a device configuration in which the overhang 16 is not formed (for example, a device configuration illustrated in FIG. 23).

In the device configuration illustrated in FIG. 23, an insulating layer (an insulating layer 25a) configured to electrically isolate the first electrodes 14 for respective pixels from one another is configured of the third insulating layer 15C that is configured to planarize a region between the first electrodes 14 and an upper insulating layer 151 that is formed on the third insulating layer 15C. For example, as with the above-described second embodiment, the insulating layer 25a may be formed on the entire surface of the substrate 11 by, for example, a CVD method after forming layers until the third insulating layer 15C (after performing polishing by CMP). After that, an opening 152 is formed in the upper insulating layer 151 by etching with use of, for example, a photolithography method. It is to be noted that processes other than a process of forming the insulating layer 25a are similar to those in the above-described first embodiment.

The hole injection layer 17, the organic layer 18, and the second electrode 19 are formed in this order on the insulating layer 25a. With such a configuration, flatness of the second electrode 19 is enhanced, and the above-described prevention of disconnection and the above-described reduction in resistance are achievable.

However, as with the above-described second embodiment, since this configuration in which the insulating layer 25 has the overhang 16 and is planarized between pixels is allowed to achieve prevention of disconnection of the second electrode and reduction in resistance while reducing current leakage, this configuration is superior in light emission efficiency and device characteristics.

Modification Example 3

Figure 25:
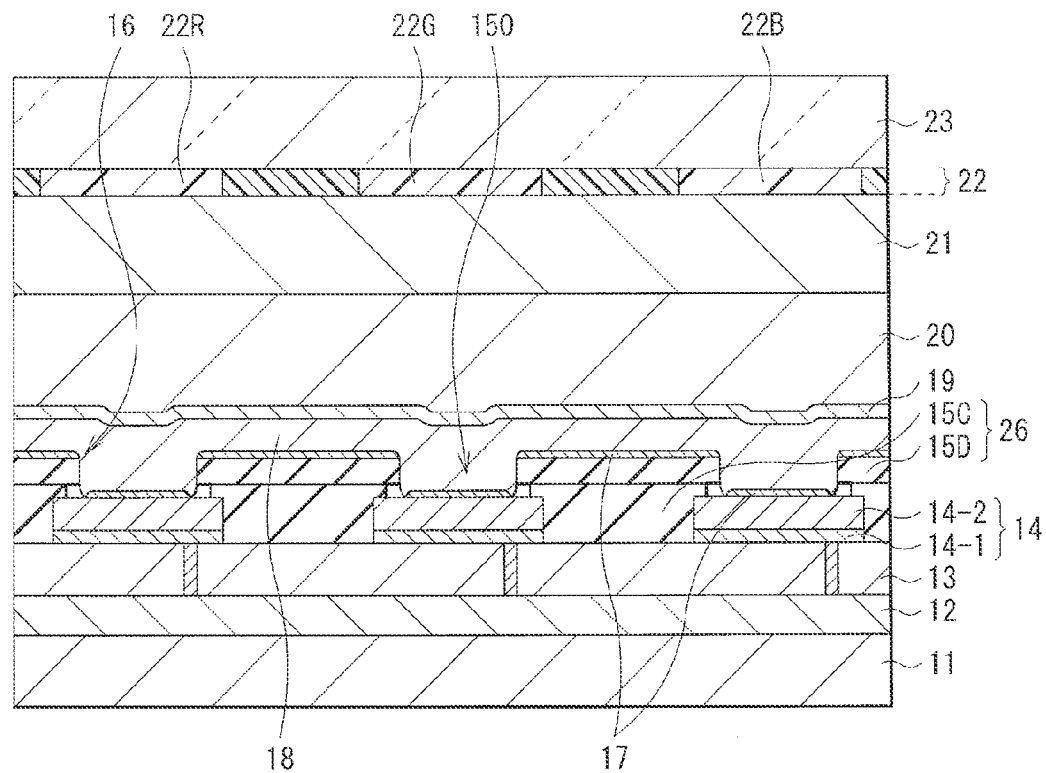
FIG. 25 is a sectional view of a display unit with a device configuration according to Modification Example 3.
Figure 26:
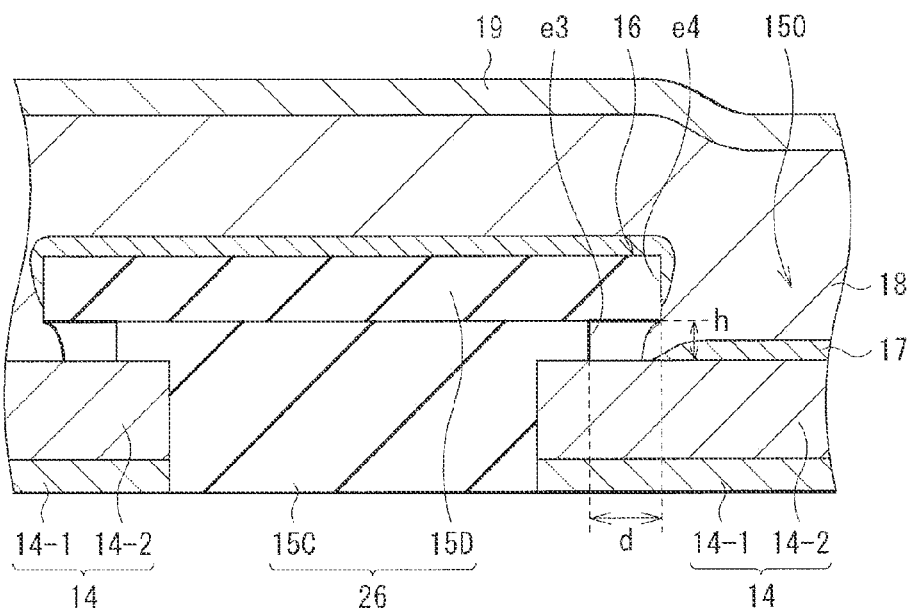
FIG. 26 is an enlarged sectional view of an opening of an insulating film and a region between pixels illustrated in FIG. 25.

FIG. 25 illustrates a sectional configuration of a display unit according to Modification Example 3. FIG. 26 is an enlarged view of a configuration around the opening 150 and a region between the first electrodes 14 (between pixels). In the above-described second embodiment, the thickness of the third insulating layer 15C in the insulating layer 25 is substantially equal to that of the first electrode 14; however, as in an insulating layer (an insulating layer 26), the thickness of the third insulating layer 15C may be larger than that of the first electrode 14.

The insulating layer 26 has a role similar to that of the insulating layers 15 and 25 in the above-described embodiments, and includes the opening 150 facing each of the first electrodes 14. The overhang 16 is formed at the edge of the opening 150. The insulating layer 26 has a two-layer configuration in which a fourth insulating layer 15D is laminated on the third insulating layer 15C in a region between the first electrodes 14. In this modification example, the third insulating layer 15C has a larger thickness than the first electrode 14, and is formed so as to be put over a side surface and a part of a top surface of the second electrode 14. In this modification example, with such a configuration, the height h of the overhang 16 is determined by a difference (for example, about 10 nm to about 50 nm) in thickness between the third insulating layer 15C and the first electrode 14.

The fourth insulating layer 15D may be made of a material allowed to obtain etching selectivity with a material forming the third insulating layer 15C selected from inorganic insulating film materials such as silicon oxide, silicon nitride, and silicon oxynitride. Moreover, the fourth insulating layer 15D may have, for example, a thickness of about 40 nm to about 90 nm both inclusive. The thicknesses of the third insulating layer 15C and the fourth insulating layer 15D are not limited; however, the thickness of the fourth insulating layer 15D may be preferably larger than that of the third insulating layer 15C.

In this modification example, at the edge of the opening 150 of the insulating layer 26, the fourth insulating layer 15D projects over from the end edge e3 of the third insulating layer 15C, and an projecting portion of the fourth insulating layer 15D is the overhang 16. In other words, at the edge of the opening 150, the third insulating layer 15C is formed so as to position the end edge e3 thereof behind an end edge e4 of the fourth insulating layer 15D. At the overhang 16, at least the hole injection layer 17 is cut or has lower resistance.

Figure 27A:
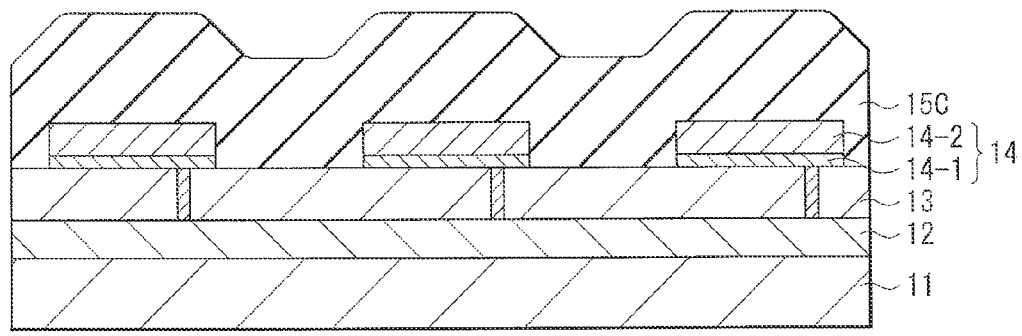
FIG. 27A is a sectional view for describing a method of manufacturing the display unit illustrated in FIG. 25.
Figure 27B:
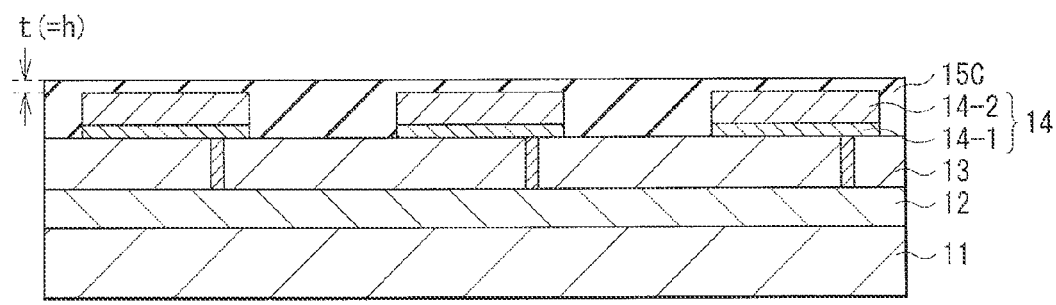
FIG. 27B is a sectional view illustrating a process following FIG. 27A.

For example, such an insulating layer 26 may be formed as follows. For example, as illustrated in FIG. 27A, the third insulating layer 15C is formed on the entire surface of the substrate 11 so as to have a thickness thick enough for the third insulating layer 15C to be embedded in a depression region between the first electrodes 14 and to be put over the first electrodes 14. Next, as illustrated in FIG. 27B, the surface of the third insulating layer 15C is polished by, for example, a CMP (Chemical Mechanical Polishing) method to be planarized. At this time, polishing start from the surface (the top surface) of the third insulating layer 15C, and the polishing is finished after a lapse of predetermined time. At this time, processing time is adjusted so as to allow the third insulating layer 15C to remain with a predetermined thickness t (=the height h) on the first electrodes 14. It is to be noted that, in a case where the third insulating layer 15C is formed by a HDP method, processing to allow the third insulating layer 15C to remain with the above-described thickness t may be performed by, for example, etching back such as dry etching.

As described above, in this modification example, the third insulating layer 15C is formed with the thickness t on the first electrode 14 while planarizing the region between the first electrodes 14.

Figure 28A:
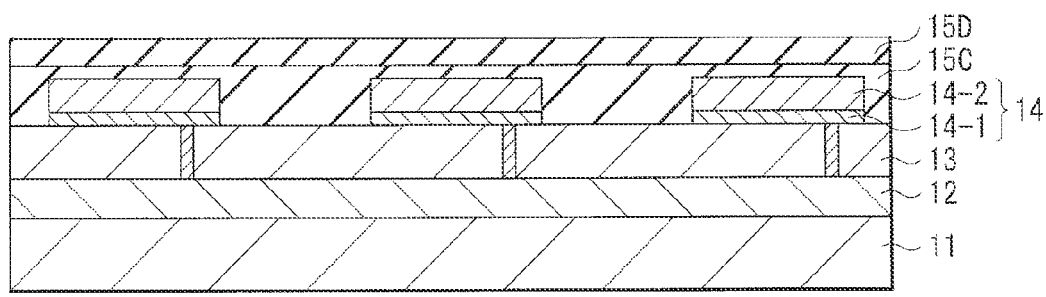
FIG. 28A is a sectional view illustrating a process following FIG. 27B.
Figure 28B:
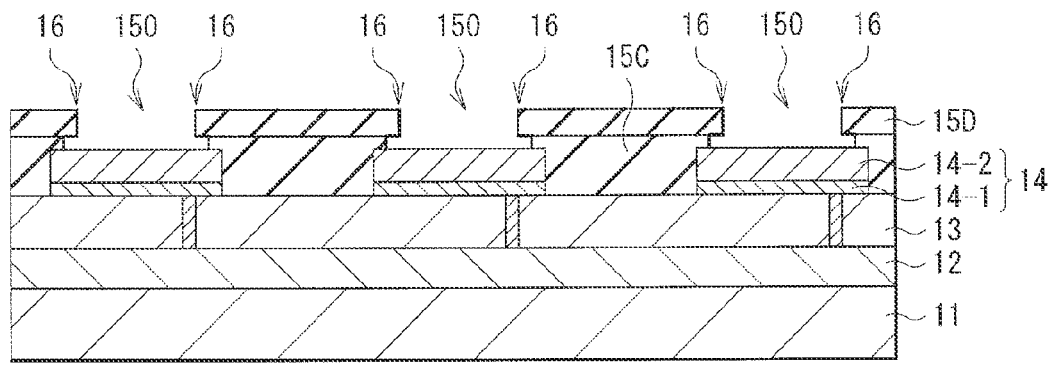
FIG. 28B is a sectional view illustrating a process following FIG. 28A.

After that, as illustrated in FIG. 28A, the fourth insulating layer 15D made of the above-described material with the above-described thickness is formed by, for example, a CVD method. Next, as illustrated in FIG. 28B, an opening is formed in the fourth insulating layer 15D by anisotropic dry etching with use of, for example, a photolithography method. Next, the opening 150 is formed by performing, for example, isotropic dry etching or isotropic wet etching on an exposed portion of the third insulating layer 15C, and the overhang 16 is formed at the edge of the opening 150. Thus, the insulating layer 26 is formed.

As with this modification example, when the third insulating layer 15C is planarized, the third insulating layer 15C may remain with a predetermined thickness on the first electrode 14, and the overhang 16 may be formed with use of the remaining third insulating layer 15C. In such a case, while flatness between the first electrodes 14 is enhanced, a leak current is allowed to be reduced. Therefore, effects similar to those in the above-described second embodiment are allowed to be obtained. Moreover, since the insulating layer 26 is configured of two layers, compared to the above-described second embodiment in which the insulating layer 26 is configured of three layers, the number of processes is allowed to be reduced.

Figure 29:
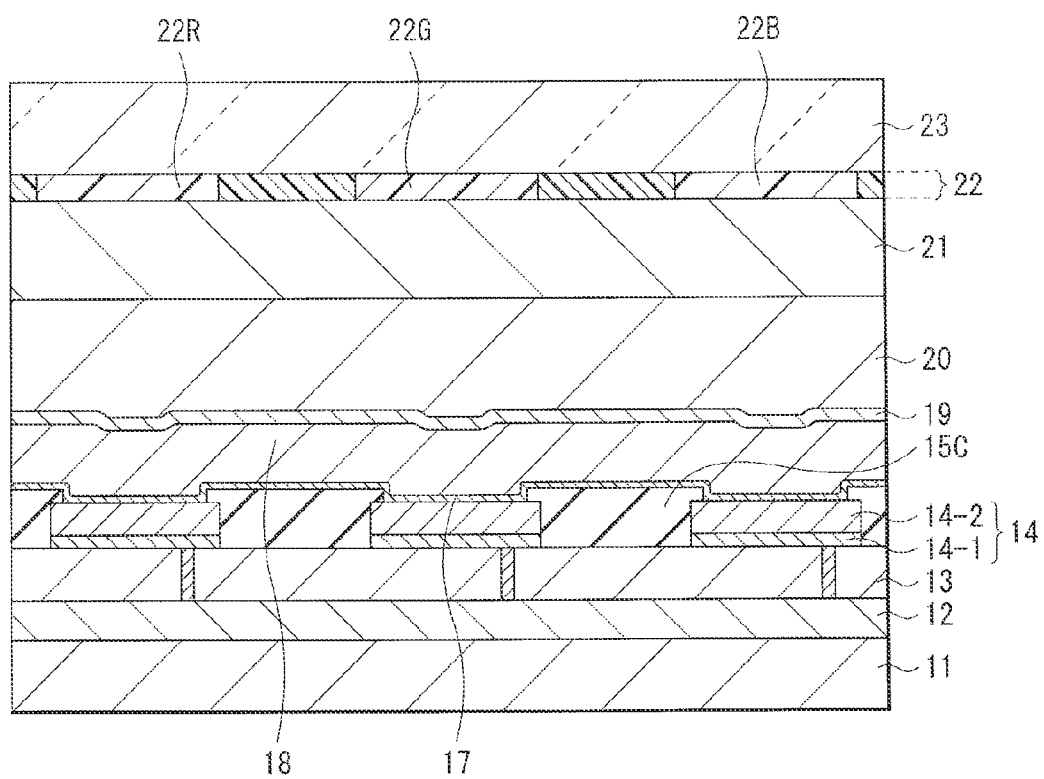
FIG. 29 is a sectional view of a display unit with a device configuration according to another modification example.

It is to be noted that a configuration, a forming process, and effects specific to the planarized portion of the insulating layer 26 in the above-described Modification Example 3 are applicable to a device configuration in which the overhang 16 is not formed (for example, a device configuration illustrated in FIG. 29).

In the device configuration illustrated in FIG. 29, only the third insulating layer 15C described in the above-described Modification Example 3 electrically isolates the first electrodes 14 for respective pixels from one another, and planarizes the region between the first electrodes 14. Such a device configuration is allowed to be formed by forming the third insulating layer 15C in, for example, a similar manner to the above-described Modification Example 3, and then forming the hole injection layer 17, the organic layer 18, and the second electrode 19 in this order in a similar manner to the above-described first embodiment. Thus, flatness of the second electrode 19 is allowed to be enhanced, and the above-described prevention of disconnection and the above-described reduction in resistance are achievable.

APPLICATION EXAMPLES

Figure 30:
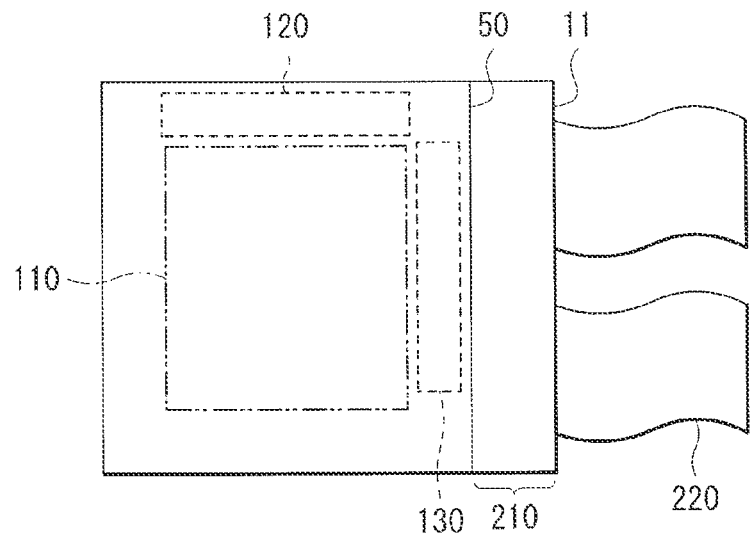

Any of the display units according to the above-described embodiments and the above-described modification examples is incorporated into various electronic apparatuses such as Application Examples 1 to 5 that will be described later as, for example, a module illustrated in FIG. 30. In particular, the display units according to the above-described embodiments and the above-described modification examples are suitable for electronic apparatuses, such as a viewfinder of a video camera and a single-lens reflex camera and a head-mounted display, that demand high resolution and is used by zooming an image before eyes. In this module, for example, a region 210 exposed from the sealing substrate 21 and the adhesive layer 21 may be provided on a side of the substrate 11, and an external connection terminal (not illustrated) may be formed in the region 210 by extending wiring of the signal line drive circuit 120 and the scanning line drive circuit 130. In the external connection terminal, a flexible printed circuit (FPC) 220 for signal input and output may be provided.

Application Example 1

Figure 31:
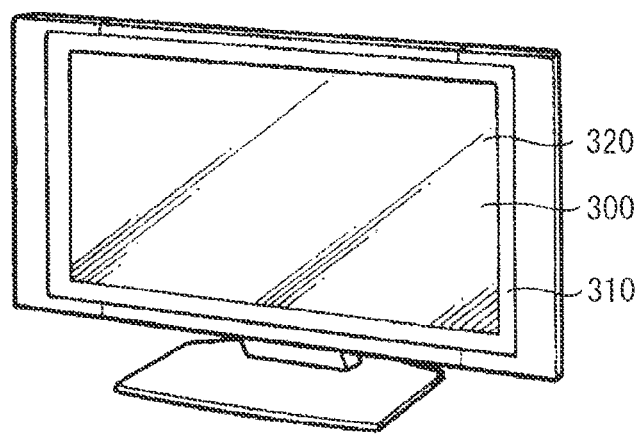
FIG. 31 is a perspective view illustrating an appearance of Application Example 1.

FIG. 31 illustrates an appearance of a television. The television may include, for example, an image display screen section 300 including a front panel 310 and a filter glass 320, and the image display screen section 300 is configured of any one of the display units according to the above-described embodiments and the like.

Application Example 2

Figure 32A:
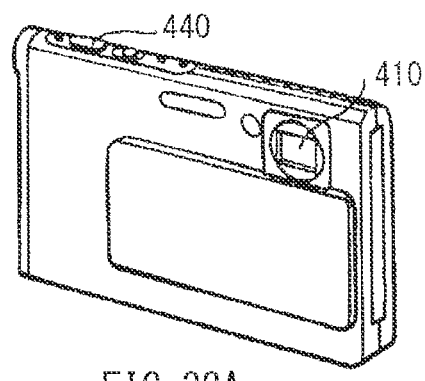
FIG. 32A is a perspective view illustrating an appearance viewed from a front side of Application Example 2.
Figure 32B:
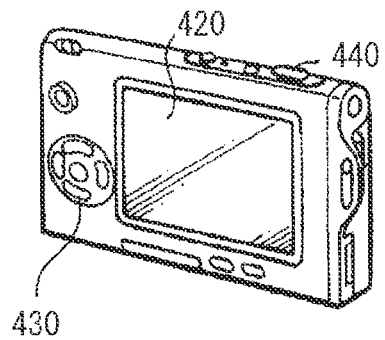
FIG. 32B is a perspective view illustrating an appearance viewed from a back side of Application Example 2.

FIGS. 32A and 32B illustrate an appearance of a digital camera. The digital camera may include, for example, a light-emitting section 410 for a flash, a display section 420, a menu switch 430, and a shutter button 440, and the display section 420 is configured of any one of the display units according to the above-described embodiments and the like.

Application Example 3

Figure 33:
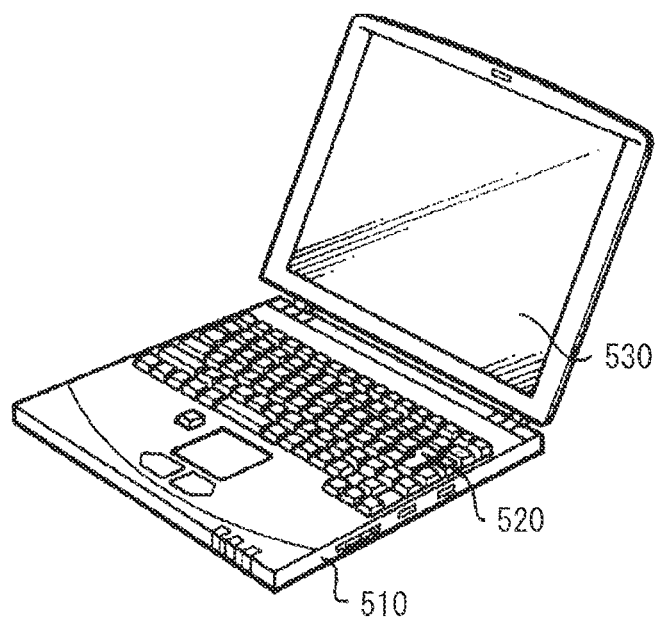
FIG. 33 is a perspective view illustrating an appearance of Application Example 3.

FIG. 33 illustrates an appearance of a notebook personal computer. The notebook personal computer may include, for example, a main body 510, a keyboard 520 for operation of inputting characters and the like, and a display section 530 for displaying of an image, and the display section 530 is configured of any one of the display units according to the above-described embodiments and the like.

Application Example 4

Figure 34:
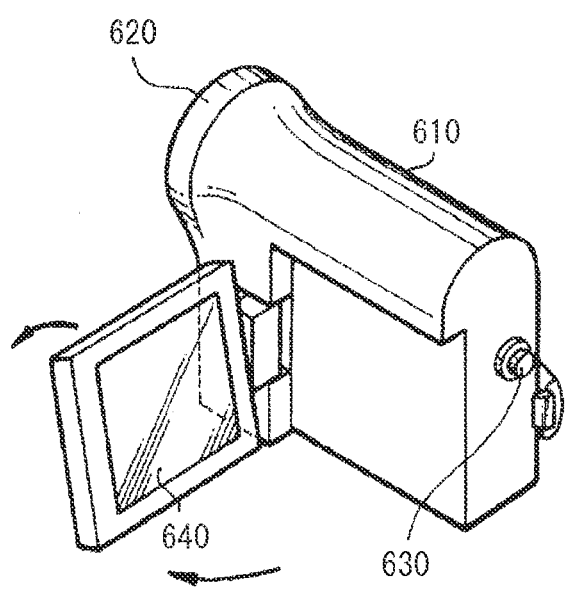
FIG. 34 is a perspective view illustrating an appearance of Application Example 4.

FIG. 34 illustrates an appearance of a video camera. The video camera may include, for example, a main section 610, a lens 620 provided on a front surface of the main section 610 and for shooting of an image of an object, a shooting start/stop switch 630, and a display section 640, and the display section 640 is configured of any one of the display units according to the above-described embodiments and the like.

Application Example 5

Figure 35A:
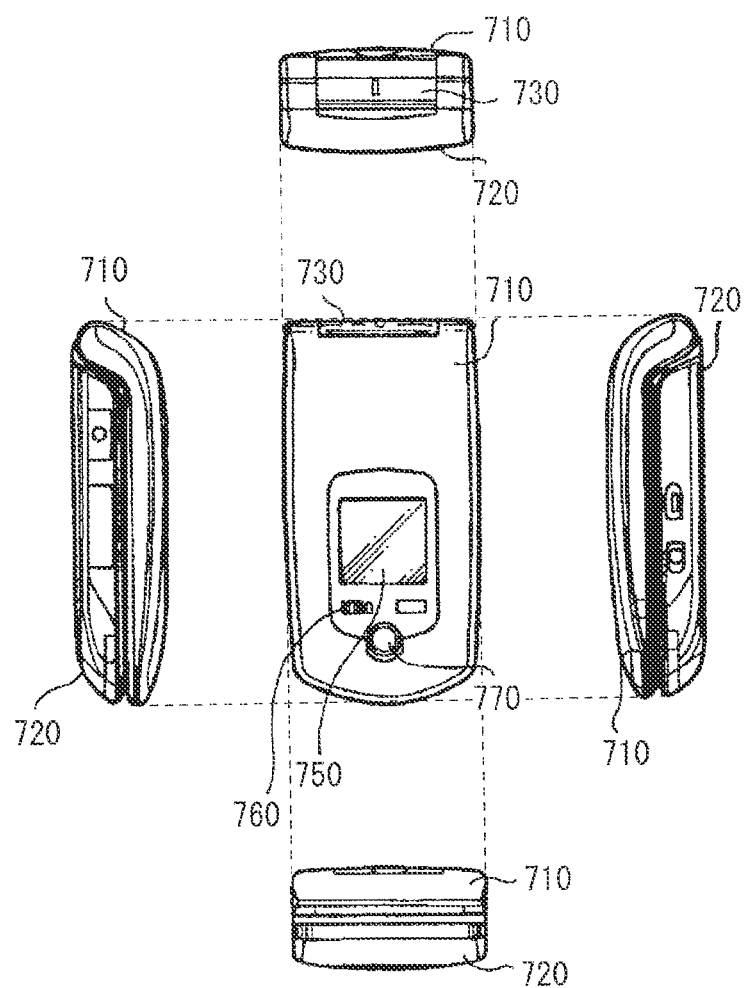
FIG. 35A is a front view, a left side view, a right side view, a top view, and a bottom view in a state in which Application Example 5 is closed.
Figure 35B:
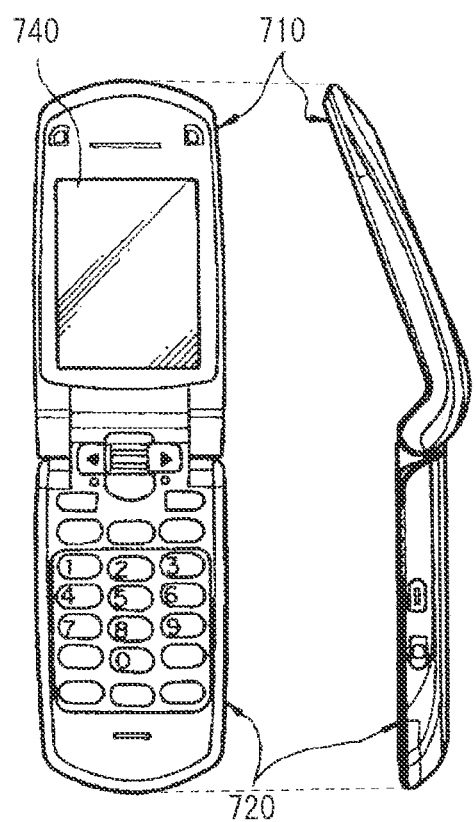
FIG. 35B is a front view and a side view in a state in which Application Example 5 is opened.

FIGS. 35A and 25B illustrate an appearance of a cellular phone. The cellular phone may be formed by connecting, for example, a top-side enclosure 710 and a bottom-side enclosure 720 to each other by a connection section (hinge section) 730, and the cellular phone may include a display 740, a sub-display 750, a picture light 760, and a camera 770. The display 740 or the sub-display 750 is configured of any one of the display units according to the above-described embodiments and the like.

Figure 36:
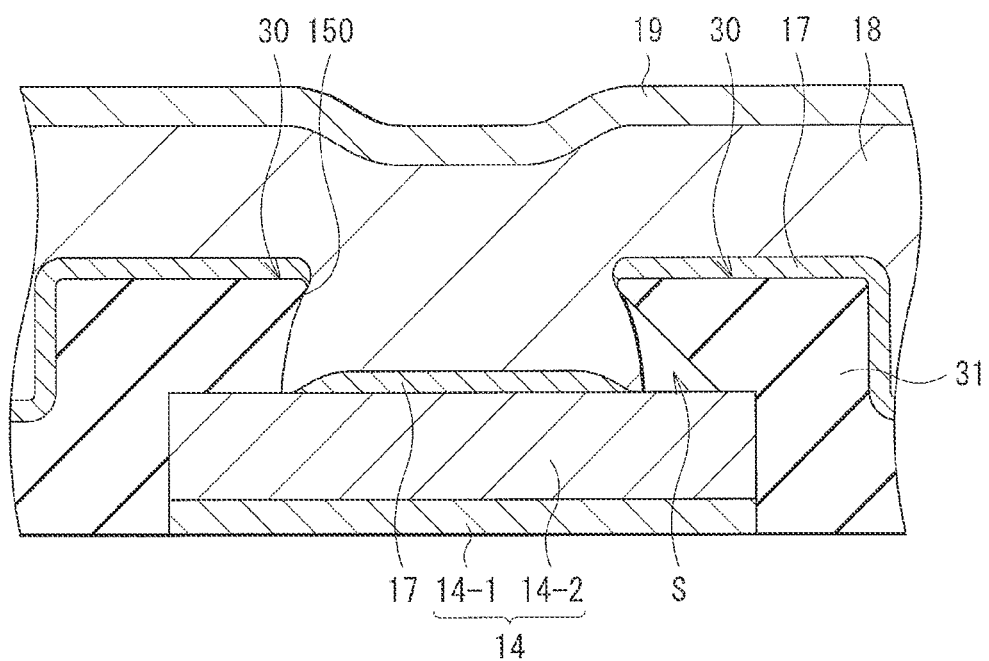
FIG. 36 is a sectional view illustrating a device configuration according to another modification example.

Although the present technology is described referring to the embodiments and the modification examples, the present technology is not limited thereto, and may be variously modified. For example, in the above-described embodiments and the like, the insulating layer that electrically isolates the first electrodes 14 for respective pixels from one another is configured of a laminate film, and the overhang is formed by performing etching or the like in two stages; however, as a technique of forming the overhang is not limited to the above-described technique, and any of various techniques may be used. For example, as illustrated in FIG. 36, the edge of the opening 150 of an insulating layer 31 is formed in a tapered shape to provide a space S between the insulating layer 31 and the first electrode 14. Thus, the overhang 30 is allowed to be formed. Such an inverse tapered shape may be formed by, for example, dry etching.

Moreover, in the above-described embodiments and the like, a case where the first electrode 14 serves as the anode, and the second electrode 19 serves as the cathode is described; however, the first electrode 14 may serve as the cathode, and the second electrode 19 may serve as the anode. In this case, since the electron injection layer and the electron transport layer are formed on the first electrode 14, the electron injection layer or both of the electron injection layer and the electron transport layer are cut or have higher resistance by the overhang of the insulating layer.

Further, the material and thickness of each layer are not limited to those described in the above-described embodiments and the like, and each layer may be made of any other material with any other thickness.

It is to be noted that the present technology may have the following configurations.

(1) A display unit including, in order from a substrate:

a plurality of first electrodes provided to respective pixels;

an insulating layer having an opening facing each of the first electrodes and having an overhang at an edge of the opening;

a charge injection-transport layer being cut or having higher resistance at the overhang of the insulating layer to exhibit one or both of a charge injection property and a charge transport property;

an organic layer including one light-emitting layer or a plurality of light-emitting layers common to all of the pixels; and a second electrode formed on an entire surface of the organic layer, the first electrodes, the insulating layer, the charge injection-transport layer, the organic layer, and the second electrode being disposed in this order from a substrate side.

(2) The display unit according to (1), in which the insulating layer includes a first inorganic layer and a second inorganic layer that are laminated in this order from the first electrode side, and the overhang is a portion of the second inorganic layer, the portion projecting over from an end edge of the first inorganic layer toward inside of the opening at the edge of the opening.

(3) The display unit according to (2), in which the first and second inorganic layers are made of materials that are allowed to obtain etching selectivity and are different from each other.

(4) The display unit according to (2) or (3), in which a thickness of the second inorganic layer is larger than that of the first inorganic layer.

(5) The display unit according to any one of (1) to (4), in which the insulating layer includes a third inorganic layer that is embedded in a region between the first electrodes and is planarized.

(6) The display unit according to (5), in which a thickness of the third inorganic layer is substantially equal to that of the first electrode, the insulating layer includes a first inorganic layer and a second inorganic layer laminated in this order from the first electrode side on the third inorganic layer, and the overhang is a portion of the second inorganic layer, the portion projecting over from an end edge of the first inorganic layer toward inside of the opening at an edge of the opening.

(7) The display unit according to (5), in which a thickness of the third inorganic layer is larger than that of the first electrode, the insulating layer includes a fourth inorganic layer laminated on the third inorganic layer, and the overhang is a portion of the fourth inorganic layer, the portion projecting over from an end edge of the third inorganic layer toward inside of the opening at an edge of the opening.

(8) The display unit according to any one of (1) to (7), in which each of the first electrodes includes a metal oxide layer forming a part of the insulating layer, the insulating layer includes a fifth inorganic layer on the first electrodes, and the overhang is a portion of the fifth inorganic layer, the portion projecting over from an inner wall of the metal oxide layer toward inside of the opening at an edge of the opening.

(9) The display unit according to any one of (1) to (8), in which each of the first electrodes has a depression on a surface thereof, the insulating layer includes a fifth inorganic layer on the first electrodes, and the overhang is a portion of the fifth inorganic layer, the portion projecting over from an inner wall of the depression toward inside of the opening at an edge of the opening.

(10) The display unit according to any one of (1) to (9), in which the charge injection-transport layer includes a hole injection layer.

(11) The display unit according to any one of (1) to (10), in which the organic layer is formed by laminating the plurality of light-emitting layers, and the organic layer emits white light by mixing of light of colors emitted from the respective light-emitting layers.

(12) A method of manufacturing a display unit, the method including:

forming a plurality of first electrodes provided to respective pixels on a substrate;

forming an insulating layer on the plurality of first electrodes, the insulating layer having an opening facing each of the first electrodes and having an overhang at an edge of the opening;

forming a charge injection-transport layer on the insulating layer, the charge-injection-transport layer being cut or having higher resistance at the overhang of the insulating layer to exhibit one or both of a charge injection property and a charge transport property;

forming, on the charge injection-transport layer, an organic layer including a light-emitting layer common to all of the pixels; and forming a second electrode on an entire surface of the organic layer.

(13) The method of manufacturing the display unit according to (12), in which, in the forming of the insulating layer, a first inorganic layer and a second inorganic layer are formed in this order on the plurality of the first electrodes, and in a selective region corresponding to each of the first electrodes, the second inorganic layer is etched, and then isotropic etching is performed on the first inorganic layer to form the opening with the overhang.

(14) The method of manufacturing the display unit according to (12), in which in the forming of the insulating layer, a third inorganic layer is formed on the plurality of first electrodes to be embedded in a region between the first electrodes, and the third inorganic layer is planarized.

(15) The method of manufacturing the display unit according to (14), in which the third inorganic layer is planarized until a surface of each of the first electrodes is exposed, after the third inorganic layer is planarized, a first inorganic layer and a second inorganic layer are formed in this order, and in a selective region corresponding to each of the first electrodes, the second inorganic layer is etched, and then isotropic etching is performed on the first inorganic layer to form the opening with the overhang.

(16) The method of manufacturing the display unit according to (14), in which the third inorganic layer is planarized to remain with a predetermined thickness on the first electrodes, a fourth inorganic layer is formed on the planarized third inorganic layer, and in a selective region corresponding to each of the first electrodes, the fourth inorganic layer is etched, and then isotropic etching is performed on the third inorganic layer to form the opening with the overhang.

(17) The method of manufacturing the display unit according to (12), in which in the forming of the first electrodes, a metal oxide layer is formed by oxidizing a surface of each of the first electrodes, and in the forming of the insulating layer, a fifth inorganic layer is formed on the plurality of first electrodes, and in a selective region corresponding to each of the first electrodes, the fifth inorganic layer is etched, and then isotropic etching is performed on the metal oxide layer to form the opening with the overhang.

(18) The method of manufacturing the display unit according to (12), in which, in the forming of the insulating layer, a fifth inorganic layer is formed on the plurality of first electrodes, and in a selective region corresponding to each of the first electrodes, the fifth inorganic layer is etched, and then isotropic etching is performed on each of the first electrodes to form a depression, thereby forming the opening with the overhang.

(19) The method of manufacturing the display unit according to (12), in which the charge injection-transport layer includes a hole injection layer.

(20) An electronic apparatus provided with a display unit, the display unit including, in order from a substrate:

a plurality of first electrodes provided to respective pixels;

an insulating layer having an opening facing each of the first electrodes and having an overhang at an edge of the opening;

a charge injection-transport layer being cut or having higher resistance at the overhang of the insulating layer to exhibit one or both of a charge injection property and a charge transport property;

an organic layer including one light-emitting layer or a plurality of light-emitting layers common to all of the pixels; and a second electrode formed on an entire surface of the organic layer, the first electrodes, the insulating layer, the charge injection-transport layer, the organic layer, and the second electrode being disposed in this order from a substrate side.

It should be understood by those skilled in the art that various modifications, combinations, sub-combinations, and alterations may occur depending on design requirements and other factors insofar as they are within the scope of the appended claims or the equivalents thereof.

What is claimed is:

1. A display unit comprising:
a plurality of first electrodes provided to respective pixels;
an insulating layer having an opening facing each of the first electrodes and having an overhang at an edge of the opening, wherein the opening is centered over the respective first electrode;
a charge injection-transport layer being cut or having higher resistance at the overhang of the insulating layer to exhibit one or both of a charge injection property and a charge transport property;
an organic layer including one light-emitting layer or a plurality of light-emitting layers common to all of the pixels, wherein a portion of the organic layer is within a space directly between the overhang and the first electrode; and
a second electrode formed on an entire surface of the organic layer,
wherein the first electrodes, the insulating layer, the charge injection-transport layer, the organic layer, and the second electrode being disposed in this order from a substrate side.

2. The display unit according to claim 1, wherein
the insulating layer includes a first inorganic layer and a second inorganic layer that are laminated in this order from sides of the first electrode, and
the overhang is a portion of the second inorganic layer, the portion projecting over from an end edge of the first inorganic layer toward inside of the opening at the edge of the opening.

3. The display unit according to the display unit according to claim 2, wherein the first and second inorganic layers are made of materials that are allowed to obtain etching selectivity and are different from each other.

4. The display unit according to claim 2, wherein a thickness of the second inorganic layer is larger than that of the first inorganic layer.

5. The display unit according to claim 1, wherein the insulating layer includes a third inorganic layer that is embedded in a region between the first electrodes and is planarized.

6. The display unit according to claim 5, wherein
a thickness of the third inorganic layer is substantially equal to that of the first electrode,
the insulating layer includes a first inorganic layer and a second inorganic layer laminated in this order from the first electrode side on the third inorganic layer, and
the overhang is a portion of the second inorganic layer, the portion projecting over from an end edge of the first inorganic layer toward inside of the opening at an edge of the opening.

7. The display unit according to claim 5, wherein
a thickness of the third inorganic layer is larger than that of the first electrode,
the insulating layer includes a fourth inorganic layer laminated on the third inorganic layer, and
the overhang is a portion of the fourth inorganic layer, the portion projecting over from an end edge of the third inorganic layer toward inside of the opening at an edge of the opening.

8. The display unit according to claim 1, wherein
each of the first electrodes includes a metal oxide layer forming a part of the insulating layer,
the insulating layer includes a fifth inorganic layer on the first electrodes, and
the overhang is a portion of the fifth inorganic layer, the portion projecting over from an inner wall of the metal oxide layer toward inside of the opening at an edge of the opening.

9. The display unit according to claim 1, wherein
each of the first electrodes has a depression on a surface thereof,
the insulating layer includes a fifth inorganic layer on the first electrodes, and
the overhang is a portion of the fifth inorganic layer, the portion projecting over from an inner wall of the depression toward inside of the opening at an edge of the opening.

10. The display unit according to claim 1, wherein the charge injection-transport layer includes a hole injection layer.

11. The display unit according to claim 1, wherein the organic layer is formed by laminating the plurality of light-emitting layers, and the organic layer emits white light by mixing of light of colors emitted from the respective light-emitting layers.

12. A method of manufacturing a display unit, the method comprising:
forming a plurality of first electrodes provided to respective pixels on a substrate;
forming an insulating layer on the plurality of first electrodes, the insulating layer having an opening facing each of the first electrodes and having an overhang at an edge of the opening, wherein the opening is centered over the respective first electrode;
forming a charge injection-transport layer on the insulating layer, the charge-injection-transport layer being cut or having higher resistance at the overhang of the insulating layer to exhibit one or both of a charge injection property and a charge transport property;
forming, on the charge injection-transport layer, an organic layer including a light-emitting layer common to all of the pixels and filling a portion of a space directly between the overhang and the first electrode with the organic layer; and
forming a second electrode on an entire surface of the organic layer.

13. The method of manufacturing the display unit according to claim 12, wherein, in the forming of the insulating layer, a first inorganic layer and a second inorganic layer are formed in this order on the plurality of the first electrodes, and in a selective region corresponding to each of the first electrodes, the second inorganic layer is etched, and then isotropic etching is performed on the first inorganic layer to form the opening with the overhang.

14. The method of manufacturing the display unit according to claim 12, wherein, in the forming of the insulating layer, a third inorganic layer is formed on the plurality of first electrodes to be embedded in a region between the first electrodes, and the third inorganic layer is planarized.

15. The method of manufacturing the display unit according to claim 14, wherein
the third inorganic layer is planarized until a surface of each of the first electrodes is exposed,
after the third inorganic layer is planarized, a first inorganic layer and a second inorganic layer are formed in this order, and
in a selective region corresponding to each of the first electrodes, the second inorganic layer is etched, and then isotropic etching is performed on the first inorganic layer to form the opening with the overhang.

16. The method of manufacturing the display unit according to claim 14, wherein
the third inorganic layer is planarized to remain with a predetermined thickness on the first electrodes,
a fourth inorganic layer is formed on the planarized third inorganic layer, and
in a selective region corresponding to each of the first electrodes, the fourth inorganic layer is etched, and then isotropic etching is performed on the third inorganic layer to form the opening with the overhang.

17. The method of manufacturing the display unit according to claim 12, wherein
in the forming of the first electrodes, a metal oxide layer is formed by oxidizing a surface of each of the first electrodes, and
in the forming of the insulating layer, a fifth inorganic layer is formed on the plurality of first electrodes, and in a selective region corresponding to each of the first electrodes, the fifth inorganic layer is etched, and then isotropic etching is performed on the metal oxide layer to form the opening with the overhang.

18. The method of manufacturing the display unit according to claim 12, wherein, in the forming of the insulating layer, a fifth inorganic layer is formed on the plurality of first electrodes, and in a selective region corresponding to each of the first electrodes, the fifth inorganic layer is etched, and then isotropic etching is performed on each of the first electrodes to form a depression, thereby forming the opening with the overhang.

19. The method of manufacturing the display unit according to claim 12, wherein the charge injection-transport layer includes a hole injection layer.

20. An electronic apparatus provided with a display unit, the display unit comprising:
a plurality of first electrodes provided to respective pixels;
an insulating layer having an opening facing each of the first electrodes and having an overhang at an edge of the opening;
a charge injection-transport layer being cut or having higher resistance at the overhang of the insulating layer to exhibit one or both of a charge injection property and a charge transport property;
an organic layer including one light-emitting layer or a plurality of light-emitting layers common to all of the pixels, wherein a portion of the organic layer is within a space directly between the overhang and the first electrode; and
a second electrode formed on an entire surface of the organic layer,
the first electrodes, the insulating layer, the charge injection-transport layer, the organic layer, and the second electrode being disposed in this order from a substrate side.

* * * * *